United States Patent
Kawakami et al.

(10) Patent No.: US 11,953,833 B2
(45) Date of Patent: Apr. 9, 2024

(54) COMPOUND, SUBSTRATE FOR PATTERN FORMATION, PHOTODEGRADABLE COUPLING AGENT, PATTERN FORMATION METHOD, AND TRANSISTOR PRODUCTION METHOD

(71) Applicants: NIKON CORPORATION, Tokyo (JP); KANAGAWA UNIVERSITY, Yokohama (JP)

(72) Inventors: Yusuke Kawakami, Yokohama (JP); Kazuo Yamaguchi, Yokohama (JP); Michiko Itou, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 960 days.

(21) Appl. No.: 16/843,232

(22) Filed: Apr. 8, 2020

(65) Prior Publication Data

US 2020/0233304 A1   Jul. 23, 2020

Related U.S. Application Data

(63) Continuation of application No. PCT/JP2018/037023, filed on Oct. 3, 2018.

(30) Foreign Application Priority Data

Oct. 11, 2017  (JP) .................................. 2017-197501
Mar. 13, 2018  (JP) .................................. 2018-045274

(51) Int. Cl.
 *G03F 7/075* (2006.01)
 *C07F 7/18* (2006.01)
 (Continued)

(52) U.S. Cl.
 CPC .......... *G03F 7/0755* (2013.01); *C07F 7/1804* (2013.01); *C23C 18/204* (2013.01);
 (Continued)

(58) Field of Classification Search
 CPC .... G03F 7/0755; C07F 7/1804; C07F 7/0838; C07F 7/18; H10K 71/621
 See application file for complete search history.

(56) References Cited

U.S. PATENT DOCUMENTS

2006/0222865 A1  10/2006  Hoshino et al.
2009/0317608 A1  12/2009  Furukawa
(Continued)

FOREIGN PATENT DOCUMENTS

EP  1 736 477 A1  12/2006
EP  2 116 900 A1  11/2009
(Continued)

OTHER PUBLICATIONS

Office Action, dated Sep. 19, 2022, in Chinese Patent Application No. 201880065020.3 (14 pp.).
(Continued)

*Primary Examiner* — Mark F. Huff
*Assistant Examiner* — Alexander Nicholas Lee
(74) *Attorney, Agent, or Firm* — STAAS & HALSEY LLP

(57) ABSTRACT

A compound represented by Formula (1). [In the formula, X represents a halogen atom or an alkoxy group, $R^1$ represents any one group selected from an alkyl group having 1 to 5 carbon atoms, a group represented by Formula (R2-1), and a group represented by Formula (R2-2), $R^2$ represents a group represented by Formula (R2-1) or (R2-2), n0 represents an integer of 0 or greater, n1 represents an integer of 0 to 5, and n2 represents a natural number of 1 to 5.]

(Continued)

[Formula 1]

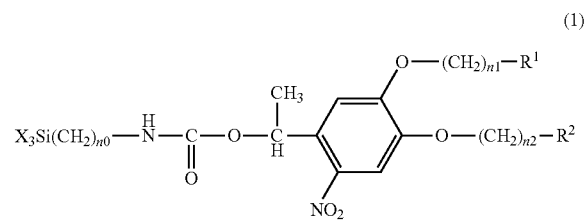

(1)

14 Claims, 8 Drawing Sheets

(51) Int. Cl.
| | |
|---|---|
| C23C 18/20 | (2006.01) |
| C23C 18/44 | (2006.01) |
| H10K 10/46 | (2023.01) |
| H10K 71/00 | (2023.01) |
| G03F 7/20 | (2006.01) |
| H10K 10/84 | (2023.01) |

(52) U.S. Cl.
CPC ........... *C23C 18/44* (2013.01); *H10K 10/466* (2023.02); *H10K 71/621* (2023.02); *G03F 7/20* (2013.01); *H10K 10/481* (2023.02); *H10K 10/84* (2023.02)

(56) References Cited

U.S. PATENT DOCUMENTS

| | | | |
|---|---|---|---|
| 2012/0263662 A1 | 10/2012 | Iimura et al. | |
| 2017/0285471 A1* | 10/2017 | Kawakami | G03F 7/2002 |
| 2019/0352260 A1* | 11/2019 | Kawakami | H01L 29/49 |

FOREIGN PATENT DOCUMENTS

| | | |
|---|---|---|
| JP | 2007-248726 A | 9/2007 |
| JP | 2011-149017 A | 8/2011 |
| JP | 2011-259001 | 12/2011 |
| JP | 4997765 B2 | 5/2012 |
| JP | 2015-192066 | 11/2015 |
| JP | 2016-157111 A | 9/2016 |
| WO | 2008/105503 A1 | 9/2008 |
| WO | 2011/078407 A1 | 6/2011 |

OTHER PUBLICATIONS

Office Action, dated Jan. 18, 2022, in Japanese Patent Application No. 2018-045274 (5 pp.).
Office Action, dated May 25, 2022, in Chinese Patent Application No. 201880065020.3 (17 pp.).
International Search Report dated Jan. 15, 2019, in corresponding International Patent Application No. PCT/JP2018/037023 (4 pages).
Written Opinion of the International Searching Authority dated Jan. 15, 2019, in corresponding International Patent Application No. PCT/JP2018/037023 (10 pages).

* cited by examiner

COMPOUND, SUBSTRATE FOR PATTERN FORMATION, PHOTODEGRADABLE COUPLING AGENT, PATTERN FORMATION METHOD, AND TRANSISTOR PRODUCTION METHOD

CROSS-REFERENCE TO RELATED APPLICATIONS

This application is a Continuation Application, under 35 U.S.C. § 111 (a), of International Patent Application No. PCT/JP2018/037023, filed on Oct. 3, 2018, which claims foreign priority benefit under 35 U.S.C. § 119 of Japanese Patent Application No. 2017-197501 filed on Oct. 11, 2017 in the Japanese Intellectual Property Office and Japanese Patent Application No. 2018-045274, filed on Mar. 13, 2018 in the Japanese Intellectual Property Office, the contents of both of which are incorporated herein by reference.

TECHNICAL FIELD

The present invention relates to a compound, a substrate for pattern formation, a photodegradable coupling agent, a pattern formation method, and a transistor production method.

BACKGROUND ART

Recently, in the production of fine devices such as semiconductor elements, integrated circuits, and devices for organic EL displays, a method of forming patterns having different surface characteristics on a substrate to prepare a fine device using their differences in surface characteristics has been suggested.

As a pattern formation method using the differences in surface characteristics on a substrate, a method of forming a hydrophilic region and a water-repellent region on a substrate and coating the hydrophilic region with an aqueous solution containing a functional material is exemplified. According to this method, since the aqueous solution containing a functional material only spreads in the hydrophilic region, a thin film pattern for a functional material can be formed.

As a material capable of forming a hydrophilic region and a water-repellent region on a substrate, for example, PTL 1 discloses a fluorine-containing compound capable of changing the contact angle before and after irradiation with light. However, from the viewpoint of the environmental residue, a material that does not contain fluorine has been desired.

CITATION LIST

Patent Literature

Patent Literature 1

Japanese Patent No. 4997765

SUMMARY OF INVENTION

According to a first embodiment of the present invention, a compound represented by Formula (1) is provided.

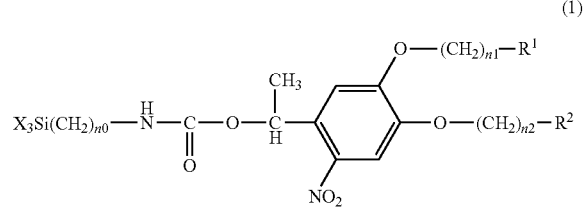

(1)

[In the formula, X represents a halogen atom or an alkoxy group, $R^1$ represents any one group selected from an alkyl group having 1 to 5 carbon atoms, a group represented by Formula (R2-1), and a group represented by Formula (R2-2), $R^2$ represents a group represented by Formula (R2-1) or (R2-2), n0 represents an integer of 0 or greater, n1 represents an integer of 0 to 5, and n2 represents a natural number of 1 to 5.]

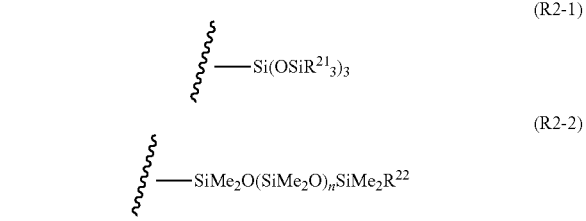

[In the formulae, $R^{21}$ and $R^{22}$ each independently represents an alkyl group having 1 to 5 carbon atoms, and n represents a natural number. The wavy line represents a bonding site.]

According to a second embodiment of the present invention, a substrate for pattern formation is provided which has a surface chemically modified by the compound according to the first embodiment of the present invention.

According to a third embodiment of the present invention, a photodegradable coupling agent is provided which is formed of the compound according to the first embodiment of the present invention.

According to a fourth embodiment of the present invention, a pattern formation method of forming a pattern on a surface of an object to be treated is provided, the method including: a step of chemically modifying the surface to be treated using the compound according to the first embodiment of the present invention; a step of irradiating the chemically modified surface to be treated with light having a predetermined pattern to generate a latent image formed of a hydrophilic region and a water-repellent region; and a step of disposing a pattern-forming material in the hydrophilic region or the water-repellent region.

According to a fifth embodiment of the present invention, a pattern formation method of forming a pattern on a surface of an object to be treated is provided, the method including: a step of chemically modifying the surface to be treated using the compound according to the first embodiment of the present invention; a step of irradiating the chemically modified surface to be treated with light having a predetermined pattern to generate a latent image formed of a hydrophilic region and a water-repellent region; and a step of disposing a catalyst for electroless plating in the hydrophilic region and performing electroless plating.

According to a sixth embodiment of the present invention, a transistor production method of producing a transistor which includes a gate electrode, a source electrode, and a drain electrode is provided, the method including: a step of forming at least one electrode among the gate electrode, the source electrode, and the drain electrode using the pattern formation method according to the fourth embodiment or the fifth embodiment.

DESCRIPTION OF EMBODIMENTS

<Compound>

Figure 1:
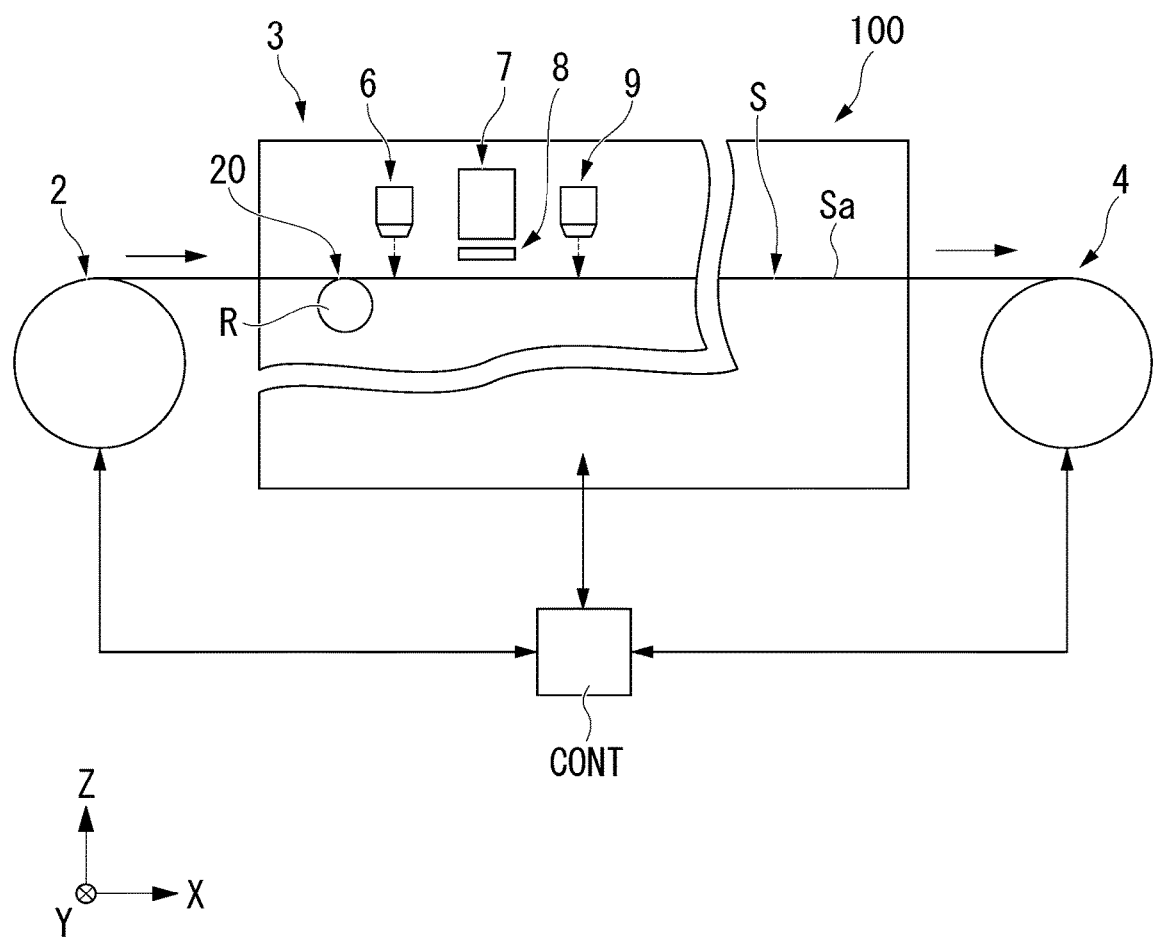
FIG. 1 is a schematic view illustrating the overall configuration of a substrate treatment device.

A first embodiment of the present invention relates to a compound represented by Formula (1). The compound according to the present embodiment contains a siloxane-based water-repellent group. In the case where a surface of an object such as a substrate is modified using the compound according to the present embodiment, the surface of the object can be reformed to be water repellent. Further, in the case where the surface thereof is irradiated with light after modification, a water-repellent group is desorbed to generate a hydrophilic group so that the surface of the object can be reformed to be hydrophilic.

It is considered that the compound according to the present embodiment can be replaced with a fluorine-based compound which has been used for reforming an object to be water repellent and is capable of exhibiting water repellency or releasability specific to a siloxane-based water-repellent group.

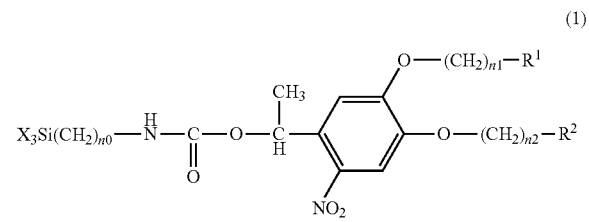

(1)

[In the formula, X represents a halogen atom or an alkoxy group, $R^1$ represents any one group selected from an alkyl group having 1 to 5 carbon atoms, a group represented by Formula (R2-1), and a group represented by Formula (R2-

2), $R^2$ represents a group represented by Formula (R2-1) or (R2-2), n0 represents an integer of 0 or greater, n1 represents an integer of 0 to 5, and n2 represents a natural number of 1 to 5.]

(R2-1)

(R2-2)

[In the formulae, $R^{21}$ and $R^{22}$ each independently represents an alkyl group having 1 to 5 carbon atoms, and n represents a natural number of 1 to 5. The wavy line represents a bonding site.]

{X}

X is a halogen atom or an alkoxy group. Examples of the halogen atom represented by X include a fluorine atom, a chlorine atom, a bromine atom, and an iodine atom, but X preferably represents an alkoxy group rather than a halogen atom. n0 represents an integer of 0 or greater. Further, from the viewpoint of availability of starting materials, n0 represents preferably an integer of 1 to 20 and more preferably an integer of 2 to 15.

{R1}

In Formula (1), $R^1$ represents an alkyl group having 1 to 5 carbon atoms or a group represented by Formula (R2-1) or (R2-2).

Examples of the alkyl group having 1 to 5 carbon atoms as $R^1$ include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is more preferable.

{n1 and n2}

In Formula (1), n1 represents an integer of 0 to 5. In the case of being disubstituted described below, it is preferable that n1 represent a natural number of 1 to 5, more preferably 2 to 4, and particularly preferably 3. In the case of being monosubstituted, it is preferable that n1 represent 0. n2 represents a natural number of 1 to 5, preferably 2 to 4, and more preferably 3.

{Group Represented by Formula (R2-1) or (R2-2)}

In Formula (1), examples of the group represented by $R^1$ and $R^2$ include a group represented by Formula (R2-1) or (R2-2).

(R2-1)

(R2-2)

[In the formulae, $R^{21}$ and $R^{22}$ each independently represents an alkyl group having 1 to 5 carbon atoms, and n represents a natural number. The wavy line represents a bonding site.]

In Formula (R2-1) or (R2-2), $R^{21}$ and $R^{22}$ each independently represents an alkyl group having 1 to 5 carbon atoms. Examples of the alkyl group having 1 to 5 carbon atoms include groups represented by $R^1$. Among these, a methyl group, an isopropyl group, or a tert-butyl group is preferable. n in Formula (R2-2) represents a natural number, preferably 1 to 200, preferably 1 to 150, and more preferably 1 to 120.

In the description below, in the case of having a group represented by Formula (R2-1) as a group represented by $R^1$ or $R^2$, this is described as "branched" in some cases. Further, in the case of having a group represented by Formula (R2-2) as a group represented by $R^1$ or $R^2$, this is described as "linear" in some cases. Further, in the case where $R^1$ represents an alkyl group, this is described as "monosubstituted" in some cases. Further, in the case where $R^1$ represents a group represented by Formula (R2-1) or (R2-2), this is described as "disubstituted" in some cases.

The compound represented by Formula (1) according to the present embodiment includes a monosubstituted branched compound, a monosubstituted chain-like compound, a disubstituted branched compound, and a disubstituted chain-like compound by adjusting the group to be introduced into $R^1$ or $R^2$.

Hereinafter, specific examples of the compound represented by Formula (1) will be described below.

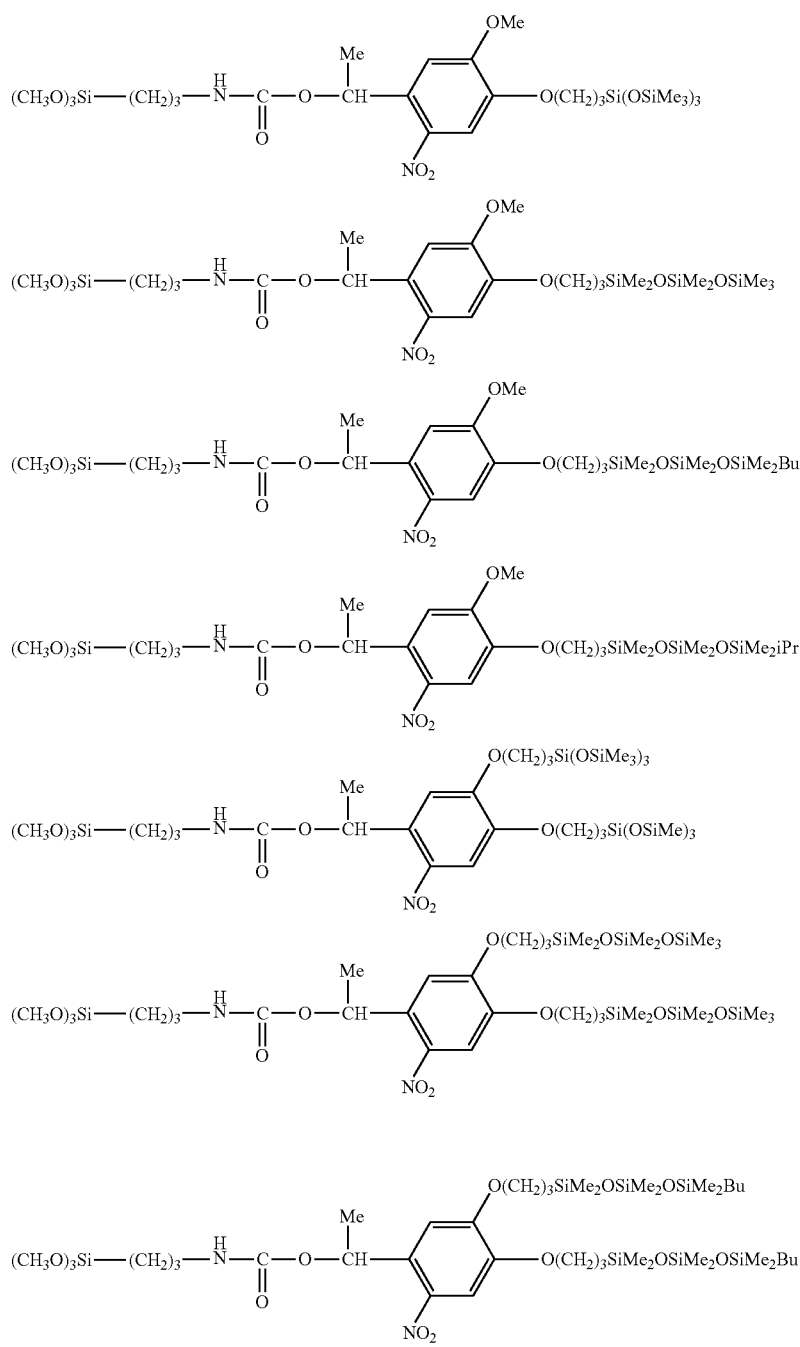

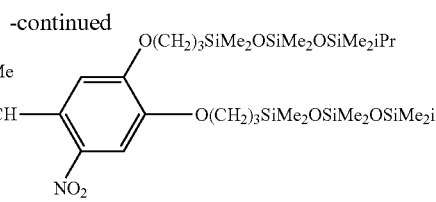

≪Method of Producing Compound≫

The compound represented by Formula (1) according to the present embodiment can be produced using the following method.

In the description of the production method below, the descriptions related to $R^1$, $R^{21}$, and $R^{22}$ are the same as described above.

[Production Method 1]

An intermediate compound 14' can be obtained by reacting a siloxane compound with an intermediate compound 14 represented by the following formula. The intermediate compound 14 may be produced using a method described in the examples below or may be synthesized using a method described in H. Nakayama et al., Colloids Surf. B, 2010, 76, p. 88 to 97.

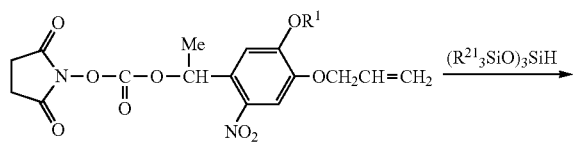

Intermediate compound 14

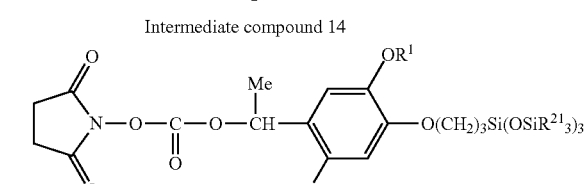

Intermediate compound 14'

[In the formulae, $R^1$ and $R^{21}$ each independently represents an alkyl group having 1 to 5 carbon atoms.]

A compound (1) of the present embodiment can be obtained by further reacting a siloxane compound with the obtained intermediate compound 14'.

[In the formulae, $R^1$ and $R^{21}$ each independently represents an alkyl group having 1 to 5 carbon atoms. X represents a halogen atom or an alkoxy group, and n0 is an integer of 0 or greater.]

[Production Method 2]

A monosubstituted linear compound represented by Formula (1) can be produced using the following method. Specifically, an intermediate compound 15 is obtained by reacting a siloxane compound with an intermediate compound 13 represented by the following formula.

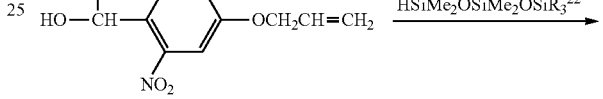

Intermediate compound 13

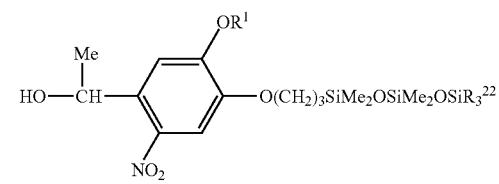

Intermediate compound 15

[In the formulae, $R^1$ and $R^{22}$ each independently represents an alkyl group having 1 to 5 carbon atoms.]

An intermediate compound 15' can be obtained by reacting succinimidyl carbonate with the obtained intermediate compound 15.

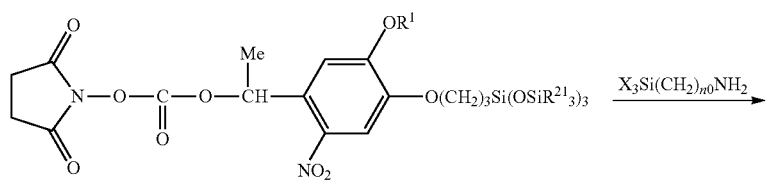

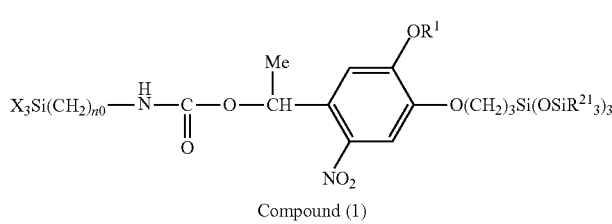

Compound (1)

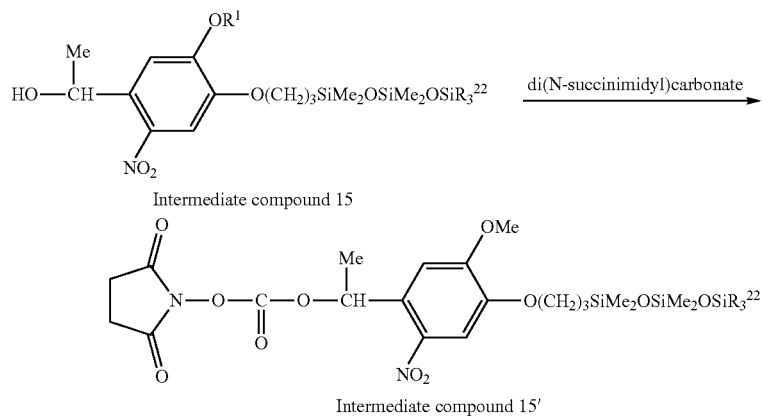

Intermediate compound 15

Intermediate compound 15'

[In the formulae, $R^1$ and $R^{22}$ each independently represents an alkyl group having 1 to 5 carbon atoms.]

The compound (1) of the present embodiment can be obtained by further reacting a siloxane compound with the obtained intermediate compound 15'.

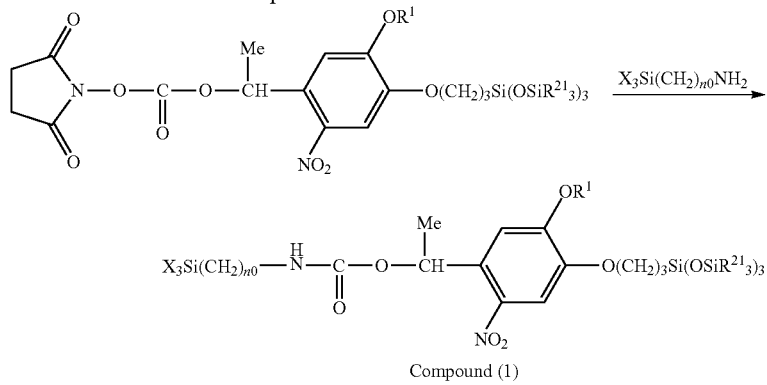

Compound (1)

[In the formulae, $R^1$ and $R^{21}$ each independently represents an alkyl group having 1 to 5 carbon atoms. X represents a halogen atom or an alkoxy group, and n0 is an integer of 0 or greater.]

[Production Method 3]

A disubstituted compound represented by Formula (1) can be produced using the following method.

Specifically, an intermediate compound 25' can be obtained by reacting each siloxane compound with an intermediate compound 25 represented by the following formula.

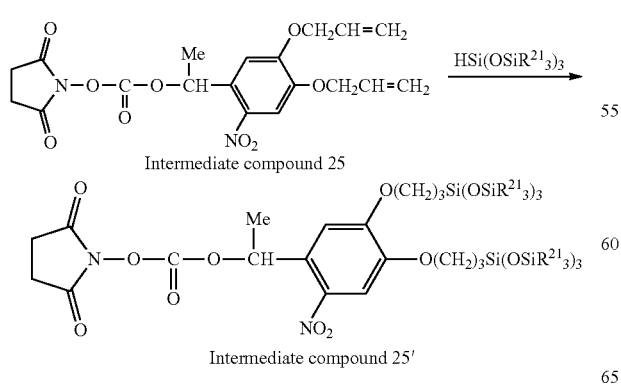

Intermediate compound 25

Intermediate compound 25'

[In the formula, $R^{21}$ represents an alkyl group having 1 to 5 carbon atoms.]

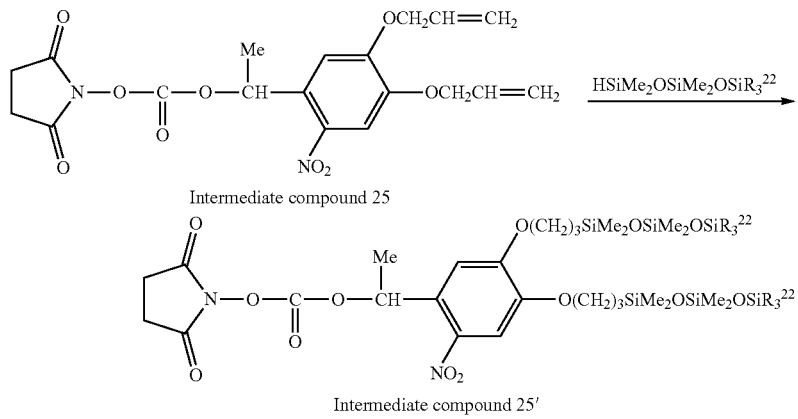
Intermediate compound 25

Intermediate compound 25'

[In the formula, $R^1$ represents an alkyl group having 1 to 5 carbon atoms.]

The compound (1) of the present embodiment can be obtained by further reacting a siloxane compound with the obtained intermediate compound 25'.

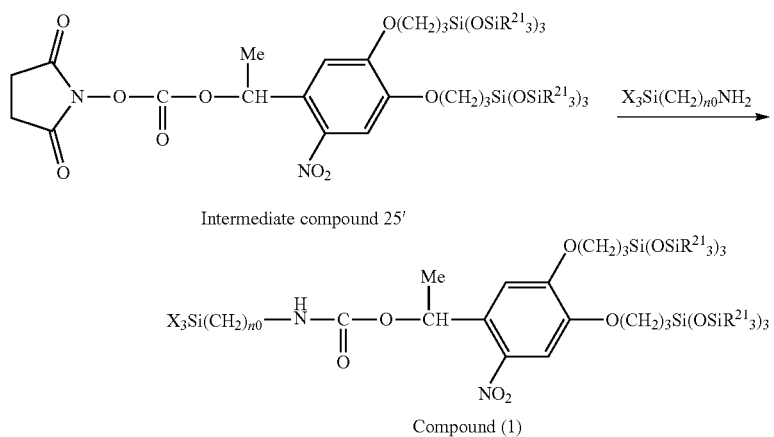
Intermediate compound 25'

Compound (1)

[In the formula, $R^1$ represents an alkyl group having 1 to 5 carbon atoms. X represents a halogen atom or an alkoxy group, and n0 is an integer of 0 or greater.]

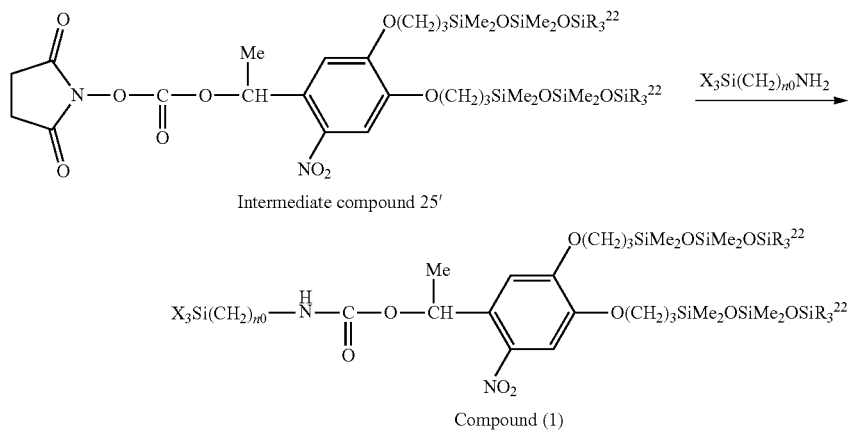
Intermediate compound 25'

Compound (1)

[In the formula, $R^1$ represents an alkyl group having 1 to 5 carbon atoms. X represents a halogen atom or an alkoxy group, and n0 is an integer of 0 or greater.]

<Substrate for Pattern Formation>

A second embodiment of the present invention relates to a substrate for pattern formation which has a surface chemically modified using the compound according to the first embodiment.

The substrate for pattern formation according to the present embodiment has a surface modified using the compound according to the first embodiment. Therefore, by selectively exposing the substrate through a mask or the like, a hydrophilic region is formed in an exposed portion and a water-repellent region is formed in an unexposed portion on the substrate for pattern formation.

By coating the substrate on which a hydrophilic region and a water-repellent region are formed with a pattern-forming material, the hydrophilic region formed in the exposed portion can be selectively coated with the pattern-forming material, and thus metal wiring and the like can be formed.

The base material is not particularly limited, and preferred examples thereof include glass, quartz glass, a silicon wafer, a plastic plate, and a metal plate. Further, a substrate on which a metal thin film is formed may be used on these substrates.

The shape of the base material is not particularly limited, and a flat surface, a curved surface, or a flat surface which is partially curved is preferable, and a flat surface is more preferable. Further, the area of the base material is not particularly limited, and a base material having a surface with a size as large as a coating method of the related art can be applied can be employed. Further, it is preferable that the surface chemically modified using the compound according to the first embodiment be formed on one flat surface of a base material on the plane.

In the case where a surface of a substrate is modified, it is preferable that the surface of the substrate be subjected to a pre-treatment in advance. As the pre-treatment method, a pre-treatment carried out using a piranha solution or a pre-treatment using a UV-ozone cleaner is preferable.

<Photodegradable Coupling Agent>

A third embodiment of the present invention relates to a photodegradable coupling agent formed of the compound according to the first embodiment.

The photodegradable coupling agent according to the present embodiment includes a photodegradable group containing a liquid-repellent group, and an adhesion group linked to the photodegradable group through a functional group, in which the liquid-repellent group has a siloxane structure, and the functional group becomes a residue of an amino group after photodegradation. Therefore, the photodegradable coupling agent according to the present embodiment is capable of greatly ensuring a difference in contact angle before and after the irradiation with light.

<Pattern Formation Method>

A fourth embodiment of the present invention relates to a pattern formation method of forming a pattern on a surface of an object to be treated, and the method includes a step of chemically modifying the surface to be treated using the compound according to the first embodiment of the present invention; a step of irradiating the chemically modified surface to be treated with light having a predetermined pattern to generate a latent image formed of a hydrophilic region and a water-repellent region; and a step of disposing a pattern-forming material in the hydrophilic region or the water-repellent region.

[Chemical Modification Step]

The present step is a step of chemically modifying the surface to be treated using the compound according to the first embodiment in the pattern formation method of forming a pattern on the surface of the object to be treated.

The object is not particularly limited, and examples thereof include a metal, a crystalline material (such as a monocrystalline material, a polycrystalline material, and a partially crystalline material), an amorphous material, a conductor, a semiconductor, an insulator, an optical element, a coated substrate, fibers, glass, ceramics, zeolite, plastic, thermosetting and thermoplastic materials (such as polyacrylate, polycarbonate, polyurethane, polystyrene, a cellulose polymer, polyolefin, polyamide, polyamide, a resin, polyester, and polyphenylene which are occasionally doped), a film, a thin film, and foil.

In the pattern formation method according to the present embodiment, it is preferable that a circuit pattern for an electronic device be formed on a flexible substrate.

In the present embodiment, for example, a resin film or foil such as stainless steel can be used as the flexible substrate serving as an object. Examples of the resin film include materials such as a polyethylene resin, a polypropylene resin, a polyester resin, an ethylene vinyl copolymer resin, a polyvinyl chloride resin, a cellulose resin, a polyamide resin, a polyimide resin, a polycarbonate resin, a polystyrene resin, and a vinyl acetate resin.

Here, flexibility indicates a property in which the substrate can be bent without being cut or fractured even in the case where an applied force is equivalent to that of the weight of the substrate. Further, the concept of flexibility also includes a property in which the substrate is bent by the weight of the substrate. Further, the flexibility varies depending on the material of the substrate, the size, the thickness, or the environment such as the temperature. In addition, as a substrate, a single strip-shaped substrate may be used or a substrate having a configuration in which a plurality of unit substrates are connected to be formed into a strip shape may be used.

In the present step, it is preferable that the entire surface of the object to be treated or a specific region be chemically modified using the compound according to the first embodiment.

The method of chemically modifying the surface of the object to be treated is not particularly limited as long as the group represented by X in Formula (1) is bonded to the substrate, and a known method such as an immersion method or a chemical treatment method can be used.

An example of chemical modification in the present step will be described.

The chemical modification in the present step can be performed by, for example, reacting the compound represented by Formula (1) with the substrate as described below.

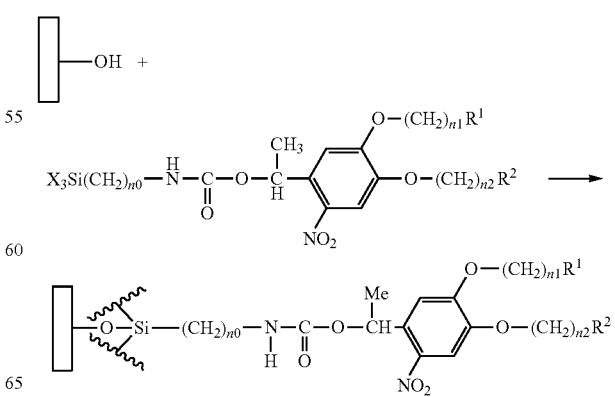

[In the formula, X represents a halogen atom or an alkoxy group, $R^1$ represents an alkyl group having 1 to 5 carbon atoms or a group represented by Formula (R2-1) or (R2-2), and $R^2$ represents a group represented by Formula (R2-1) or (R2-2), n0 represents a natural number, n1 represents an integer of 0 to 5, and n2 represents a natural number of 1 to 5.]

[Latent Image Generation Step]

The present step is a step of exposing the chemically modified surface to be treated and generating a latent image formed of a hydrophilic region and a water-repellent region.

As light to be applied at the time of exposure, ultraviolet rays are preferable. It is preferable that the light to be applied include light having a wavelength of 200 nm to 450 nm and more preferable that the light to be applied include light having a wavelength of 320 nm to 450 nm. Further, it is also preferable that light that includes light having a wavelength of 365 nm be applied. The light having these wavelengths can efficiently degrade a photodegradable group. Examples of the light source include a low-pressure mercury lamp, a high-pressure mercury lamp, an ultrahigh-pressure mercury lamp, a xenon lamp, and a sodium lamp; a gas laser such as nitrogen, a liquid laser of an organic dye solution, and a solid-state laser obtained by allowing an inorganic single crystal to contain rare earth ions.

As a light source other than the laser from which monochromatic light is obtained, light having a specific wavelength, in which a broadband line spectrum or a continuous spectrum is extracted using an optical filter such as a band pass filter or a cutoff filter, may be used. From the viewpoint that a large area can be irradiated at once, a high-pressure mercury lamp or an ultrahigh-pressure mercury lamp is preferable as a light source.

According to the pattern formation method of the present embodiment, light can be optionally applied within the above-described range, but it is preferable that light energy showing a distribution particularly corresponding to a circuit pattern be applied.

In the present step, since a group having water-repellent performance is desorbed and a residue (amino group) having hydrophilic performance is generated by irradiating the chemically modified surface to be treated with light having a predetermined pattern, a latent image formed of a hydrophilic region and a water-repellent region can be generated after the irradiation with light.

In the present step, it is preferable that a latent image having a circuit pattern due to a difference between hydrophilicity and water repellency be generated on a surface of a flexible substrate.

By irradiating the chemically modified surface to be treated with light having a predetermined pattern, a group having water-repellent performance is desorbed as shown below, and a residue (amino group) having hydrophilic performance is generated.

(R2-2), and $R^2$ represents a group represented by Formula (R2-1) or (R2-2), n0 represents a natural number, n1 represents an integer of 0 to 5, and n2 represents a natural number of 1 to 5.]

[Step of Disposing Pattern-Forming Material]

The present step is a step of disposing a pattern-forming material in the hydrophilic region or water-repellent region generated in the step described above.

Examples of the pattern-forming material include a wiring material (metal solution) obtained by dispersing particles of gold, silver, copper, alloys of these, or the like in a predetermined solvent, a precursor solution containing the above-described metals, an electronic material obtained by dissolving an insulator (resin), a semiconductor, an organic EL light-emitting material, or the like in a predetermined solvent, and a resist solution.

According to the pattern formation method of the present embodiment, it is preferable that the pattern-forming material be a conductive material, a semiconductor material, or an insulating material.

As the conductive material, a pattern-forming material formed of a dispersion liquid obtained by dispersing conductive fine particles in a dispersion medium is exemplified. As the conductive fine particles, for example, metal fine particles containing any of gold, silver, copper, palladium, nickel, and ITO, oxides of these, conductive polymers, and fine particles of a superconductor are used.

These conductive fine particles can be used by coating the surface thereof with an organic substance in order to improve the dispersibility.

The dispersion medium is not particularly limited as long as the above-described conductive fine particles can be dispersed in the dispersion medium and aggregation does not occur. Examples of the dispersion medium include water; alcohols such as methanol, ethanol, propanol, and butanol; hydrocarbon-based compounds such as n-heptane, n-octane, decane, dodecane, tetradecane, toluene, xylene, cymene, durene, indene, dipentene, tetrahydronaphthalene, decahydronaphthalene, and cyclohexylbenzene; ether-based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, and p-dioxane; and polar compounds such as propylene carbonate, g-butyrolactone, N-methyl-2-pyrrolidone, dimethylformamide, dimethyl sulfoxide, and cyclohexanone. Among these, from the viewpoints of the dispersibility of fine particles, stability of the dispersion liquid, and ease of application to a liquid droplet-discharging method (ink jet method), water, alcohols, hydrocarbon-based compounds, and ether-based compounds are preferable. As the dispersion medium, water and hydrocarbon-based compounds are more preferable.

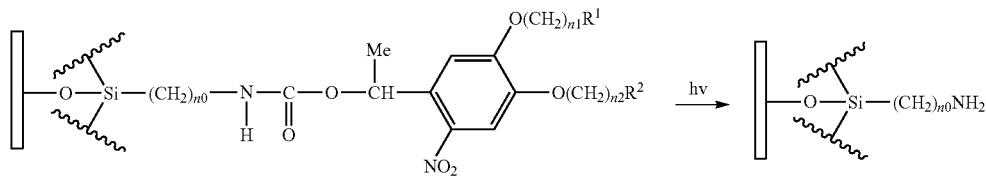

[In the formula, $R^1$ represents an alkyl group having 1 to 5 carbon atoms or a group represented by Formula (R2-1) or As the semiconductor material, an organic semiconductor material formed of a dispersion liquid obtained by dispersing or dissolving the material in a dispersion medium can be used. As the organic semiconductor material, a polymer material or a low-molecular weight material of a p electron conjugated system in which the skeleton thereof is formed of a conjugated double bond is desirable. Typical examples thereof include soluble low-molecular weight materials, for example, acenes such as pentacene, and thienoacenes such as benzothienobenzothiophene; and soluble polymer materials such as polythiophene, poly(3-alkylthiophene), and a polythiophene derivative. Further, a soluble precursor material which is changed to the above-described semiconductor through heat treatment may be used, and examples of a pentacene derivative include sulfinylacetamide pentacene. In addition, the semiconductor material is not limited to organic semiconductor materials, and inorganic semiconductor materials may be used.

Examples of the insulating material include insulating materials formed of a dispersion medium obtained by dispersing or dissolving polyimide, polyamide, polyester, acryl, PSG (phosphorus glass), BPSG (phosphorus boron glass), polysilazane-based SOG, silicate-based SOG (spin on glass), alkoxy silicate-based SOG, $SiO_2$ having a Si—CH3 bond represented by a siloxane polymer, or the like in a dispersion medium.

In the present step, as a method of disposing the pattern-forming material, a liquid droplet-discharging method, an ink jet method, a spin coat method, a roll coat method, a slot-coat method, a dip-coat method, or the like can be employed.

Hereinafter, the pattern formation method according to the present embodiment will be described with reference to the accompanying drawings.

According to the pattern formation method of the present embodiment, in the case where a flexible substrate compatible with a so-called roll-to-roll process is used, a pattern may be formed using a substrate treatment device 100, which is a roll-to-roll device, as illustrated in FIG. 1. The configuration of the substrate treatment device 100 is illustrated in FIG. 1.

As illustrated in FIG. 1, the substrate treatment device 100 includes a substrate supply unit 2 which supplies a stripe-shaped substrate (for example, a stripe-shaped film member) S; a substrate treatment unit 3 which performs a treatment on a surface (surface to be treated) Sa of the substrate S; a substrate recovery unit 4 which recovers the substrate S; a coating unit 6 which applies the compound according to the first embodiment; an exposure unit 7; a mask 8; a patterned material-coating unit 9; and a control unit CONT which controls each unit. The substrate treatment unit 3 can perform various treatments on the surface of the substrate S between the time at which the substrate S is sent out from the substrate supply unit 2 and the time at which the substrate S is recovered by the substrate recovery unit 4.

The substrate treatment device 100 can be suitably used in the case where a display element (electronic device) such as an organic EL element or a liquid crystal display element is formed on the substrate S.

Further, FIG. 1 illustrates a system of using a photomask for generating light having a desired pattern, but the present embodiment can also be suitably applied to a maskless exposure system that does not use a photomask. Examples of the maskless exposure system of generating patterned light without using a photomask include a method of using a spatial light modulation element such as DMD, and a system of scanning spot light such as a laser beam printer.

The pattern formation method according to the present embodiment will be described appropriately using an XYZ coordination system after the XYZ coordination system is set as illustrated in FIG. 1. In the XYZ coordination system, for example, an X axis and a Y axis are set along the horizontal plane, and a Z axis is set upward along the vertical direction. Further, the overall substrate treatment device 100 is along the X axis, and the substrate S is transported from a negative side (− side) to a positive side (+ side). At this time, the width direction (short length direction) of the stripe-shaped substrate S is set as the Y axis direction.

As the substrate S to be treated in the substrate treatment device 100, for example, a resin film or foil such as stainless steel can be used. Examples of the resin film include materials such as a polyethylene resin, a polypropylene resin, a polyester resin, an ethylene vinyl copolymer resin, a polyvinyl chloride resin, a cellulose resin, a polyamide resin, a polyimide resin, a polycarbonate resin, a polystyrene resin, and a vinyl acetate resin.

It is preferable that the thermal expansion coefficient of the substrate S be small so that the size thereof is not changed even in the case of being heated at approximately 200° C. The thermal expansion coefficient can be decreased by mixing an inorganic filler into a resin film. Examples of the inorganic filler include titanium oxide, zinc oxide, alumina, and silicon oxide. Further, the substrate S may be single ultrathin glass having a thickness of 100 μm which has been produced by a float glass method or the like or a laminate obtained by bonding a resin film or aluminum foil to such ultrathin glass.

The substrate S is formed such that the size thereof in the width direction (short length direction) is in a range of 1 m to 2 m and the size thereof in the length direction (long length direction) is 10 m or longer. These dimensions are merely examples and are not limited thereto. For example, the size of the substrate S in the Y direction may be 50 cm or shorter or 2 m or longer. Further, the size of the substrate S in the X direction may be 10 m or shorter.

It is preferable that the substrate S be formed to have flexibility. Here, the term flexibility indicates a property in which the substrate can be bent without being cut or fractured even in the case where an applied force is equivalent to that of the weight of the substrate. Further, the concept of flexibility also includes a property in which the substrate is bent by the weight of the substrate.

Further, the flexibility varies depending on the material of the substrate, the size, the thickness, or the environment such as the temperature. In addition, as a substrate S, a single strip-shaped substrate may be used or a substrate having a configuration in which a plurality of unit substrates are connected to be formed into a strip shape may be used.

The substrate supply unit 2 sends and supplies the substrate S wound in a roll shape to the substrate treatment unit 3. In this case, a shaft that winds the substrate S, a rotary driving device that rotates the shaft, and the like are provided in the substrate supply unit 2. In addition, a configuration in which a cover portion that covers the substrate S in a state of being wound in a roll shape may be employed. Further, the substrate supply unit 2 is not limited to the mechanism of sending out the substrate S wound in a roll shape and may have a mechanism (for example, a nip type driving roller) of sequentially sending out the stripe-shaped substrate S in the length direction thereof.

The substrate recovery unit 4 recovers the substrate S having passed through the substrate treatment device 100 by means of winding the substrate S, for example, in a roll shape. Similar to the substrate supply unit 2, the substrate recovery unit 4 is provided with a shaft for winding the substrate S, a rotary driving source that rotates the shaft, a cover portion that covers the recovered substrate S, and the like. Further, in the case where the substrate S in the substrate treatment unit 3 is cut into a panel shape, for example, the substrate is recovered in a state of being overlapped. In other words, a configuration in which the substrate S is recovered in a state different from the state in which the substrate S is wound in a roll shape may be employed.

The substrate treatment unit 3 performs a step of transporting the substrate S supplied from the substrate supply unit 2 to the substrate recovery unit 4 and chemically modifying the surface Sa of the substrates S to be treated using the compound according to the first embodiment during the process of transportation; a step of irradiating the chemically modified surface to be treated with light having a predetermined pattern; and a step of disposing the pattern-forming material. The substrate treatment unit 3 includes a compound-coating unit 6 which coats the surface Sa of the substrate S to be treated with the compound according to the first embodiment; an exposure unit 7 which irradiates the surface with light; a mask 8; a patterned material-coating unit 9; and a transport device 20 which includes a driving roller R and the like for sending the substrate S under conditions compatible with the form of the processing treatment.

As the compound-coating unit 6 and the patterned material-coating unit 9, liquid droplet coating devices (such as a liquid droplet discharge type coating device, an ink jet type coating device, a spin coat type coating device, a roll coat type coating device, and a slot-coat type coating device) are exemplified.

Each of these devices is appropriately provided along the transport path of the substrate S, and a panel and the like of a flexible display can be produced using a so-called roll-to-roll system. In the present embodiment, the exposure unit 7 is provided and a device that performs steps (a photosensitive layer formation step, a photosensitive layer development step, and the like) before and after the steps described above is provided inline as necessary.

<Wiring Pattern Formation Method Using Electroless Plating>

A fifth embodiment of the present invention relates to a pattern formation method of forming a pattern on a surface of an object to be treated, and the method includes a step of chemically modifying the surface to be treated using the compound according to the first embodiment of the present invention; a step of irradiating the chemically modified surface to be treated with light having a predetermined pattern to generate a latent image formed of a hydrophilic region and a water-repellent region; and a step of disposing a catalyst for electroless plating in the hydrophilic region and performing electroless plating.

Figure 2:
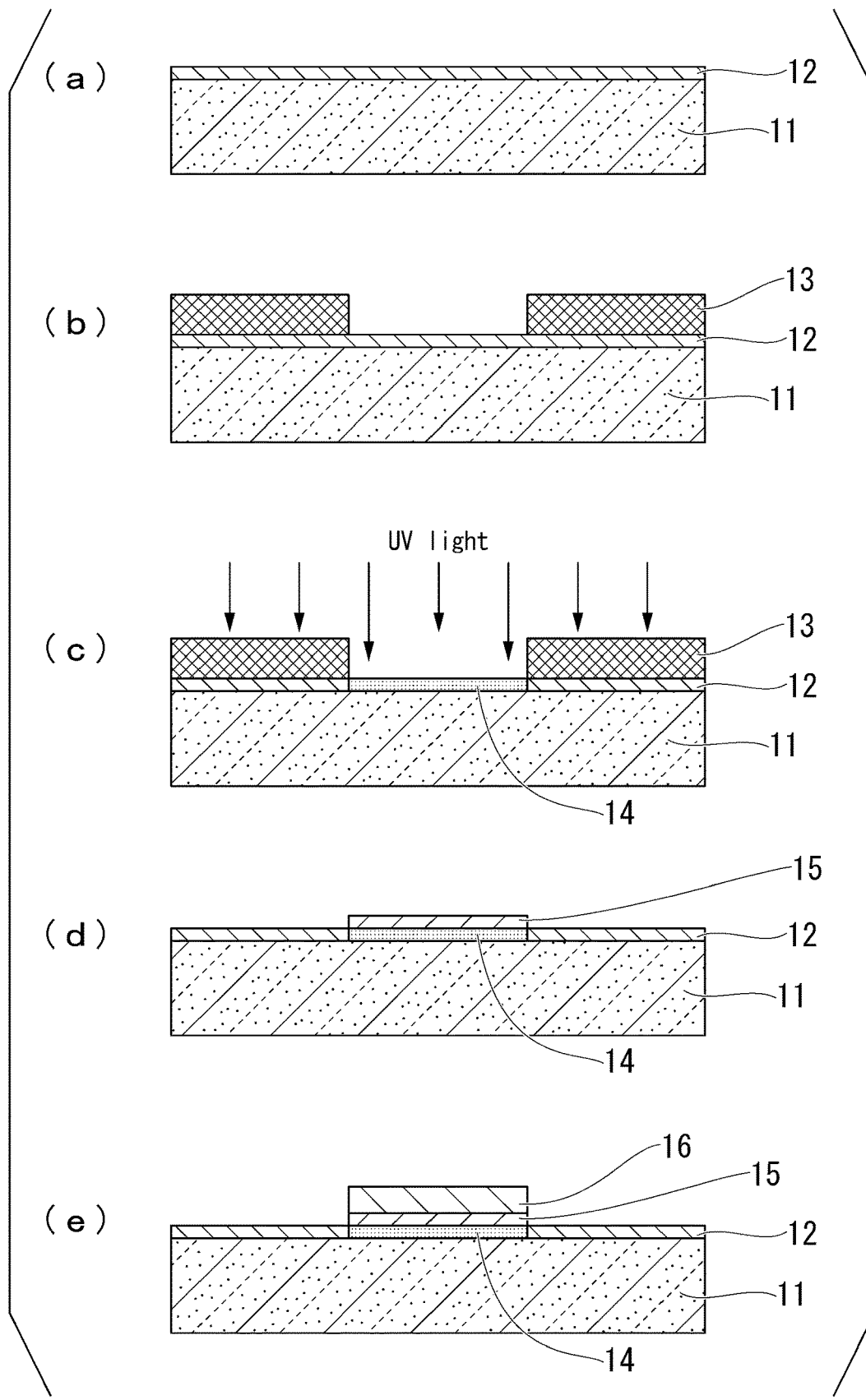
FIG. 2 is a view schematically illustrating steps of a pattern formation method.

According to the present embodiment, for example, a wiring pattern can be formed using electroless plating according to the following method. Hereinafter, the description will be made with reference to FIG. 2.

(First Step)

First, as illustrated in FIG. 2(a), a compound layer 12 is formed by applying the compound according to the first embodiment.

As the coating method, any typical film formation technique such as a physical vapor deposition (PVD) method, a chemical vapor deposition (CVD) method, and a liquid phase growth method may be used. Among these, a liquid phase growth method is preferable, and examples of the liquid phase growth method include a coating method (spin coating, dip coating, die coating, spray coating, roll coating, or brush coating) and a printing method (flexographic printing or screen printing). Further, a SAM film or an LB film may be formed.

Further, in the present step, a treatment for drying a solvent through heat or pressure reduction may be carried out.

(Second Step)

Next, as illustrated in FIG. 2(b), a photomask 13 having an exposed region with a predetermined pattern is prepared. The exposure method is not limited to means for using a photomask, and means such as projection exposure using an optical system such as a lens or a mirror or maskless exposure using a spatial light modulation element or laser beams can be used. Further, the photomask 13 may be provided so as to be in contact with the compound layer 12 or provided so as not to be in contact with the compound layer 12.

(Third Step)

Thereafter, as illustrated in FIG. 2(c), the compound layer 12 is irradiated with UV light through the photomask 13. In this manner, the compound layer 12 is exposed in the exposed region of the photomask 13 so that a hydrophilic region 14 is formed.

Further, UV light can be radiated at a wavelength such that the optimum quantum efficiency is exhibited using the structure of a photosensitive group. Examples thereof include i-line having a wavelength of 365 nm. Further, the exposure amount and the exposure time may be set such that some amino groups are generated and complete deprotection does not necessarily proceed. At this time, in the plating step described below, the conditions (the activity of a plating bath or the like) according to the progress of deprotection can be appropriately changed.

(Fourth Step)

Next, as illustrated in FIG. 2(d), a catalyst for electroless plating is applied to the surface to form a catalyst layer 15. The catalyst for electroless plating is a catalyst that reduces metal ions contained in a plating solution for electroless plating, and examples thereof include silver and palladium.

The surface of the hydrophilic region 14 is exposed to an amino group, and an amino group is capable of capturing and reducing the above-described catalyst for electroless plating. Therefore, the catalyst for electroless plating is captured only on the hydrophilic region 14 so that the catalyst layer 15 is formed. Further, as the catalyst for electroless plating, a catalyst which can be carried by an amino group can be used.

(Fifth Step)

As illustrated in FIG. 2(e), a plating layer 16 is formed by performing an electroless plating treatment. Further, examples of the material of the plating layer 16 include nickel-phosphorus (NiP) and copper (Cu).

In the present step, the substrate 11 is immersed in an electroless plating bath to reduce metal ions on the surface of the catalyst so that the plating layer 16 is deposited. At this time, since the catalyst layer 15 that carries a sufficient amount of the catalyst is formed on the surface of the hydrophilic region 14, the plating layer 16 can be selectively deposited only on the hydrophilic region 14. In the case of insufficient reduction, metal ions may be actively reduced by immersing the substrate 11 in a reducing agent solution such as sodium hypophosphite or sodium borohydride.

By performing the above-described step, a wiring pattern can be formed on a predetermined substrate using the compound according to the first embodiment.

<Transistor Production Method>

Figure 3:
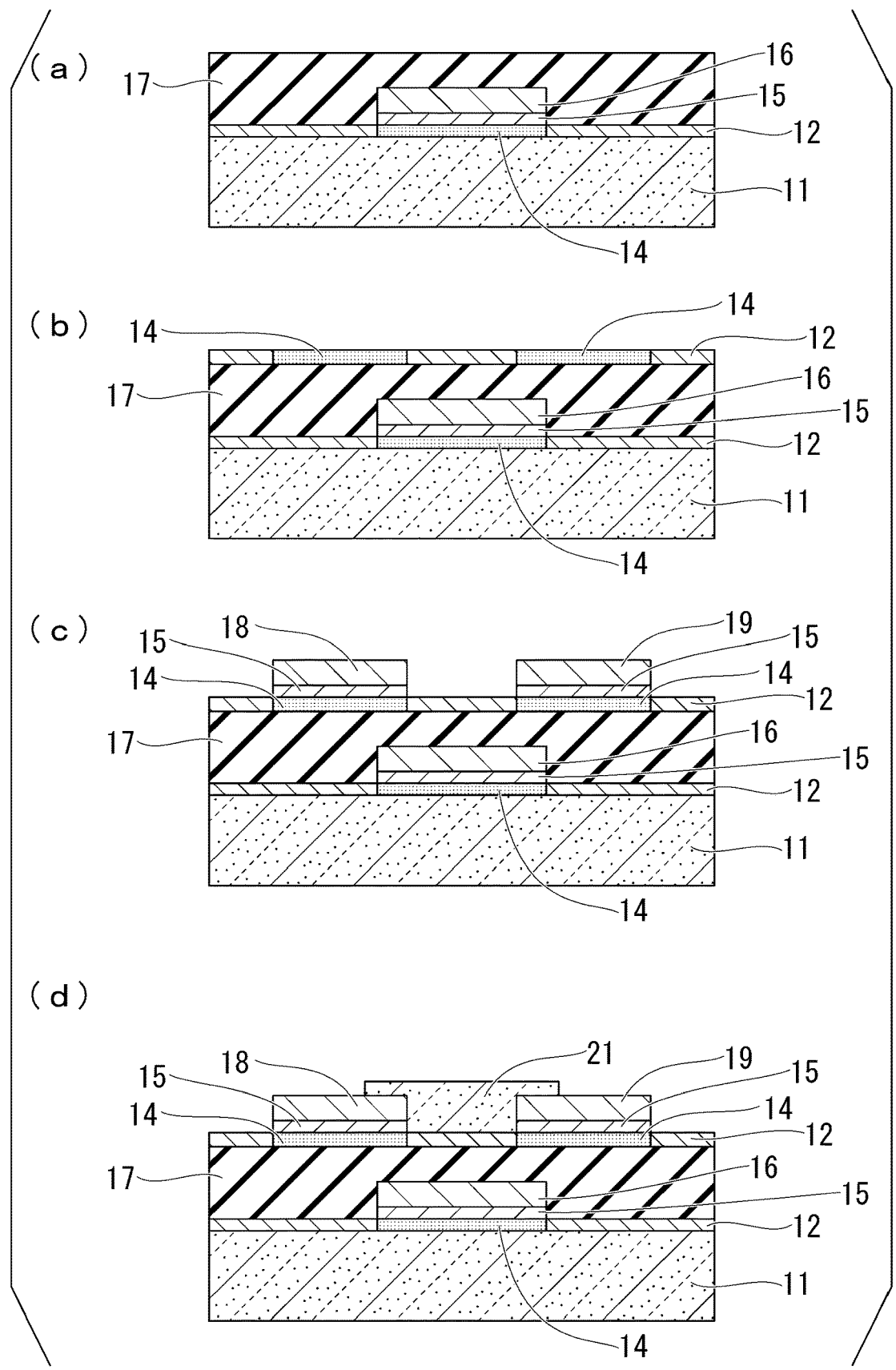
FIG. 3 is a view schematically illustrating an example of steps of a transistor production method.

Further, a transistor production method of forming the plating layer 16 obtained in the fifth step into a gate electrode will be described with reference to FIG. 3.

(Sixth Step)

As illustrated in FIG. 3(a), the compound layer 12 is covered, according to a known method, with the plating layer 16 having an electroless plating pattern formed using the above-described electroless plating pattern formation method to form an insulator layer 17 on the compound layer 12. The insulator layer 17 may be formed by coating the compound layer 12 with the coating solution obtained by dissolving one or more resins from among an ultraviolet curable acrylic resin, an epoxy resin, an ene-thiol resin, and a silicone resin in an organic solvent. The insulator layer 17 can be formed into a desired pattern by irradiating a coated film with ultraviolet rays through a mask provided with an opening portion corresponding to a region where the insulator layer 17 is formed.

(Seventh Step)

As illustrated in FIG. 3(b), the hydrophilic region 14 is formed in a portion where a source electrode and a drain electrode are formed in the same manner as in the first to third steps of the above-described electroless plating pattern formation method.

(Eighth Step)

As illustrated in FIG. 3(c), a plating layer 18 (source electrode) and a plating layer 19 (drain electrode) are formed by allowing the hydrophilic region 14 to carry the catalyst for electroless plating to form the catalyst layer 15 and performing electroless plating in the same manner as in the fourth and fifth steps of the above-described electroless plating pattern formation method. Further, examples of the material of the plating layers 18 and 19 include nickel-phosphorus (NiP) and copper (Cu), but the layers may be formed of a material different from the material of the plating layer 16 (gate electrode).

(Ninth Step)

As illustrated in FIG. 3(d), a semiconductor layer 21 is formed between the plating layer 18 (source electrode) and the plating layer 19 (drain electrode). The semiconductor layer 21 may be formed by, for example, preparing a solution obtained by dissolving an organic semiconductor material soluble in an organic solvent such as TIPS pentacene (6,13-bis(triisopropylsilylethynyl)pentacene) in the organic solvent, coating a space between the plating layer 18 (source electrode) and the plating layer 19 (drain electrode) with the solution, and drying the solution. Further, the compound layer 12 between the plating layer 18 (source electrode) and the plating layer 19 (drain electrode) may be exposed and hydrophilized before formation of the semiconductor layer 21. By hydrophilizing the portion corresponding to a channel of a transistor, the hydrophilized portion is suitably coated with the solution, and the semiconductor layer 21 tends to be selectively formed. Further, the semiconductor layer 21 may be formed by adding one or more kinds of insulating polymers such as PS (polystyrene) or PMMA (methyl polymethacrylate) to the solution, applying the solution containing the insulating polymers, and drying the solution. In this manner, in the case where the semiconductor layer 21 is formed, the insulating polymers are concentrated and formed in the lower portion of the semiconductor layer 21 (on a side of the insulator layer 17). In the case where a polar group such as an amino group is present at the interface between the organic semiconductor and the insulator layer, the transistor characteristics tend to be degraded. However, in the case where a configuration in which the organic semiconductor is provided through the above-described insulating polymers is employed, degradation of the transistor characteristics can be suppressed. In this manner, a transistor can be produced.

According to the above-described method, it is not necessary to separately provide a chemical resist and the like in the UV exposure step, and a simple step using only a photomask can be carried out. Therefore, the same applies to the step of removing the resist layer. Further, an activation treatment step of the catalyst usually required can be omitted due to the catalyst reduction ability of the amino group, and high-resolution patterning can be made while significant cost reduction and time reduction can be realized. Further, since a dip coating method can be used, this method can also be used in the roll-to-roll step due to excellent compatibility.

Further, the structure of the transistor is not particularly limited and can be appropriately selected depending on the purpose thereof. In the forms illustrated in FIGS. 2 and 3, the method of producing a bottom contact and bottom gate type transistor has been described, but a top contact and bottom gate type transistor, a top contact and top gate type transistor, and a bottom contact and top gate type transistor may be produced in the same manner as described above. Further, in the forms illustrated in FIGS. 2 and 3, the method of forming all of the gate electrode, the source electrode, and the drain electrode using the compound according to the first embodiment has been described, but only the gate electrode may be formed using the compound according to the first embodiment or only the source electrode and the drain electrode may be formed using the compound according to the first embodiment.

EXAMPLES

Hereinafter, the present invention will be described in more detail based on the examples, but the present invention is not limited to the following examples.

Synthesis of Compound 3a

Step 1; Synthesis of 1-(4-allyloxy-3-methoxyphenyl)ethanone

4-Hydroxy-3-methoxyacetophenone (5.00 g, 30.1 mmol) was put into a 300-mL eggplant flask to be dissolved in acetone (50 mL), potassium carbonate (6.24 g, 45.1 mmol) was added thereto, the solution was stirred at room temperature for 5 minutes, allyl bromide (5.46 g, 45.1 mmol) was added thereto, and the resulting solution was stirred at room temperature for 24 hours. After concentration, ethyl acetate (50 mL×2) and pure water (50 mL) were added to the solution for extraction, and the organic layer was sequentially washed with a saturated sodium carbonate aqueous solution (50 mL×3) and saturated saline solution (50 mL×2), dried over anhydrous magnesium sulfate, filtered, and concentrated, thereby obtaining 6.09 g (29.5 mmol, 98%) of pale yellow oil (intermediate compound 11; 1-(4-allyloxy-3-methoxyphenyl)ethanone).

The identification result of the obtained intermediate compound 11 is described below.

$^1$H NMR (CDCl$_3$/TMS, 400 MHz): δ 2.57 (3H, s), 3.94 (3H, s), 4.69 (2H, dt, J=5.4, 1.5 Hz), 5.33 (1H, dq, J=11, 1.3 Hz), 5.43 (1H, dq, J=17, 1.5 Hz), 6.09 (1H, ddt, J=17, 11, 5.4 Hz), 6.89 (1H, d, J=9.0 Hz), 7.52-7.56 (2H, m).

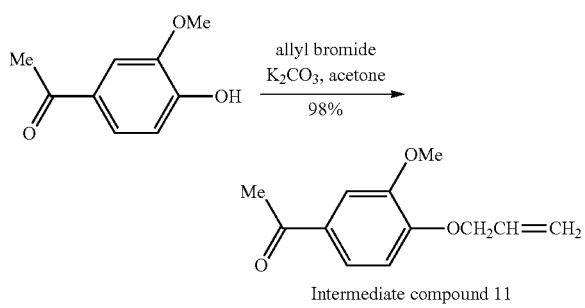

Intermediate compound 11

Step 2; Synthesis of 1-(4-allyloxy-5-methoxy-2-nitrophenyl)ethanone

The intermediate compound 11 (497 mg, 2.41 mmol) was put into a 50-mL eggplant flask to be dissolved in acetic acid (3 mL), fuming nitric acid (1 mL, 24.1 mmol) was slowly added dropwise thereto on an ice bath, and the solution was stirred at 0° C. for 30 minutes. Cold water (10 mL) was added to the resulting solution for extraction using ethyl acetate (10 mL×3), and the organic layer was sequentially washed with a saturated sodium bicarbonate aqueous solution (10 mL) and saturated saline solution (10 mL×2), dried over anhydrous magnesium sulfate, filtered, and concentrated. The resultant was purified by silica gel column chromatography (hexane:ethyl acetate=4:1→2:1), thereby obtaining 345 mg (1.37 mmol, 57%) of a yellowish white solid (intermediate compound 12; 1-(4-allyloxy-5-methoxy-2-nitrophenyl)ethanone).

The identification result of the obtained intermediate compound 12 is described below.

$^1$H NMR (CDCl$_3$/TMS, 400 MHz): δ 2.50 (3H, s), 3.98 (3H, s), 4.71 (2H, dt, J=5.5, 1.4 Hz), 5.39 (1H, dq, J=11, 1.3 Hz), 5.48 (1H, dq, J=17, 1.3 Hz), 6.07 (1H, ddt, J=17, 11, 5.4 Hz), 6.76 (1H, s), 7.62 (1H, s).

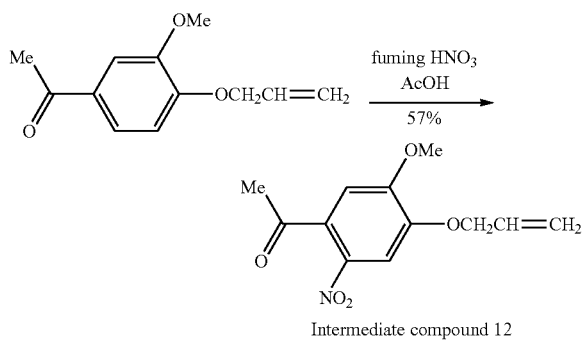

Intermediate compound 12

Step 3; Synthesis of 1-(4-allyloxy-5-methoxy-2-nitrophenyl)ethanol

The intermediate compound 12 (1.41 g, 5.61 mmol) obtained in the above-described step, tetrahydrofuran (10 mL), and methanol (10 mL) were put into a 50 mL eggplant flask, and sodium borohydride (637 mg, 16.8 mmol) was slowly added thereto on an ice bath. The solution was stirred at 0° C. for 20 minutes and further stirred at room temperature for 40 minutes. After concentration, chloroform (10 mL×3) and pure water (30 mL) were added to the resulting solution for extraction, and the organic layer was washed with saturated saline solution (20 mL×3), dried over anhydrous magnesium sulfate, filtered, and concentrated, thereby obtaining 1.40 g (5.54 mmol, 99%) of a yellowish white solid (intermediate compound 13; 1-(4-allyloxy-5-methoxy-2-nitrophenyl)ethanol).

The identification result of the obtained intermediate compound 13 is described below.

$^1$H NMR (CDCl$_3$/TMS, 400 MHz): δ 1.56 (3H, d, J=6.3 Hz), 2.29 (1H, d, J=3.7 Hz), 4.00 (3H, s), 4.67 (2H, dt, J=5.5, 1.4 Hz), 5.36 (1H, dq, J=11, 1.3 Hz), 5.46 (1H, dq, J=17, 1.5 Hz), 5.57 (1H, qd, J=6.3, 3.7 Hz), 6.07 (1H, ddt, J=17, 11, 5.4 Hz), 7.31 (1H, s), 7.59 (1H, s).

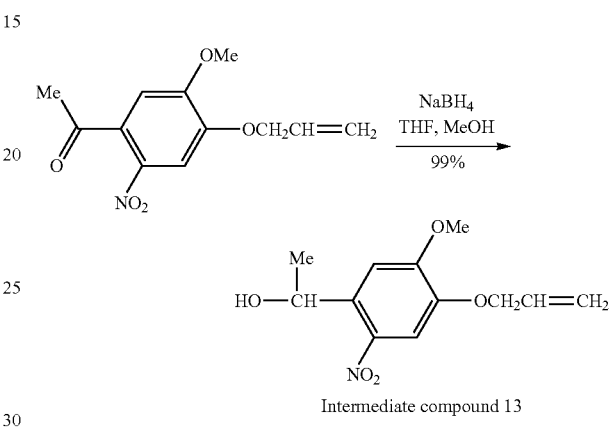

Intermediate compound 13

Step 4; Synthesis of 1-(4-allyloxy-5-methoxy-2-nitrophenyl)ethyl N-succinimidyl carbonate The intermediate compound 13 (2.50 g, 9.85 mmol) was put into a 200-mL two-necked eggplant flask to be dissolved in dry acetonitrile (35 mL), di(N-succinimidyl)carbonate (6.36 g, 24.8 mmol) and trimethylamine (4.05 g, 40.1 mmol) were added thereto, and the solution was stirred at room temperature for 17 hours in a nitrogen atmosphere. After concentration, chloroform (150 mL, 60 mL×2), pure water (200 mL), and 2 N hydrochloric acid (10 mL) were added to the resulting solution for extraction, and the organic layer was washed with saturated saline solution (100 mL×3), dried over anhydrous magnesium sulfate, filtered, and concentrated. The resultant was purified by silica gel column chromatography (hexane:ethyl acetate=2:1), thereby obtaining 2.97 g (7.54 mmol, 77%) of a yellowish white solid (intermediate compound 14; 1-(4-allyloxy-5-methoxy-2-nitrophenyl)ethyl N-succinimidyl carbonate).

The identification result of the obtained intermediate compound 14 is described below.

$^1$H NMR (CDCl$_3$/TMS, 400 MHz): δ 1.76 (3H, d, J=6.4 Hz), 2.80 (4H, s), 4.06 (3H, s), 4.67 (2H, dt, J=5.5, 1.4 Hz), 5.37 (1H, dq, J=11, 1.3 Hz), 5.47 (1H, dq, J=17, 1.5 Hz), 6.07 (1H, ddt, J=17, 11, 5.4 Hz), 6.51 (1H, q, J=6.4 Hz), 7.08 (1H, s), 7.65 (1H, s).

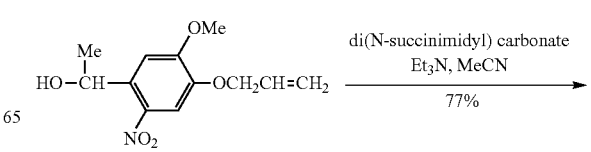

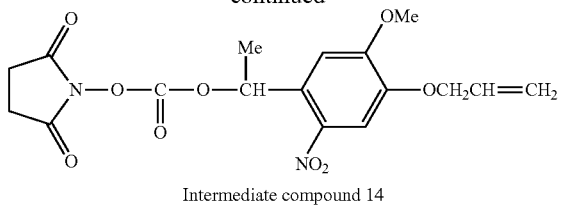

Intermediate compound 14

In the present example, the intermediate compound 14 was synthesized according to the above-described method.

For example, an intermediate compound 14 synthesized according to the method described in H. Nakayama et al., Colloids Surf. B, 2010, 76, p. 88 to 97 may be used.

Step 5; Synthesis of 1-(5-methoxy-2-nitro-4-(3-tris (trimethylsiloxy)silylpropoxy)phenyl)ethyl N-succinimidyl carbonate The intermediate compound 14 (300 mg, 0.761 mmol) was put into a 30-mL two-neck eggplant flask to be dissolved in dry tetrahydrofuran (6 mL), tris(trimethylsiloxy) silane (677 mg, 2.28 mmol) and a Karstedt's catalyst (5 drops) were added thereto, and the solution was stirred at room temperature for 20 minutes in a nitrogen atmosphere. After concentration, the resultant was purified by silica gel column chromatography (hexane:ethyl acetate:tetramethoxysilane=60:20:1→50:50:1), thereby obtaining 281 mg (0.407 mmol, 53%) of a yellow viscous material (intermediate compound 1a; 1-(5-methoxy-2-nitro-4-(3-tris(trimethylsiloxy)silylpropoxy)phenyl)ethyl N-succinimidyl carbonate).

The identification result of the obtained intermediate compound 1a is described below.

$^1$H NMR (CDCl$_3$/TMS, 400 MHz): δ 0.10 (27H, s), δ 0.10 (27H, s), 0.55-0.60 (2H, m), 1.76 (3H, d, J=6.5 Hz), 1.85-1.94 (2H, m), 2.80 (4H, s), 3.98-4.03 (2H, m), 4.04 (3H, s), 6.51 (1H, q, J=6.4 Hz), 7.07 (1H, s), 7.62 (1H, s).

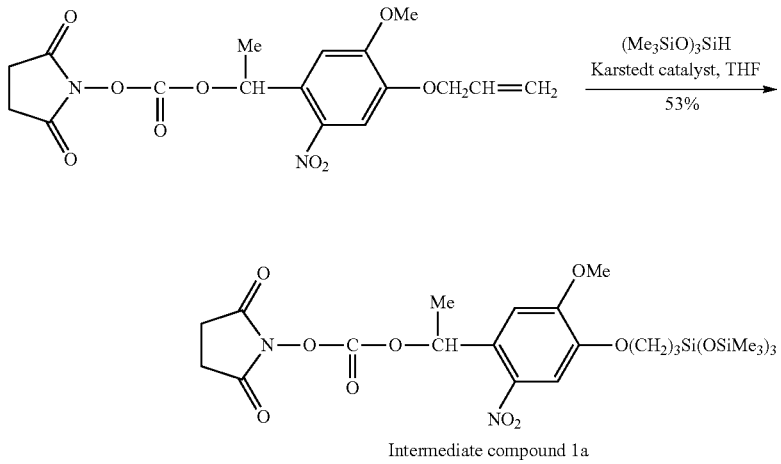

Intermediate compound 1a

Step 6: Synthesis of 1-(5-methoxy-2-nitro-4-(3-tris (trimethylsiloxy) silylpropoxy)phenyl)ethyl 3-trimethyoxysilylpropyl carbamate The intermediate compound 1a (100 mg, 0.145 mmol) was put into a 30-mL two-neck eggplant flask to be dissolved in dry tetrahydrofuran (1 mL), 3-aminopropyltrimethyoxysilane (0.028 mL, 0.161 mmol) was added thereto, and the solution was stirred at room temperature for 22 hours in a nitrogen atmosphere under a light-shielded condition. After concentration, the resultant was purified by silica gel column chromatography (hexane:ethyl acetate:tetramethoxysilane=60:20:1), thereby obtaining 48 mg (0.0636 mmol, 44%) of a light yellow viscous material.

The identification result of the obtained compound 3a according to the present embodiment is described below.

$^1$H NMR (CDCl$_3$/TMS, 400 MHz): δ 0.10 (27H, s), 0.54-0.65 (4H, m), 1.58 (3H, d, J=6.5 Hz), 1.61-1.68 (2H, m), 1.84-1.93 (2H, m), 3.10-3.18 (2H, m), 3.56 (9H, s), 3.95 (3H, s), 3.98-4.03 (2H, m), 4.95 (1H, t, J=5.2 Hz), 6.37 (1H, q, J=6.4 Hz), 6.99 (1H, s), 7.56 (1H, s).

$^{13}$C NMR (CDCl$_3$/TMS, 100 MHz): δ 1.74 (9C), 6.31, 10.3, 22.3, 23.0, 23.2, 43.3, 50.6 (3C), 56.3, 68.8, 71.6, 108.0, 108.8, 133.9, 139.6, 147.4, 153.9, 155.3.

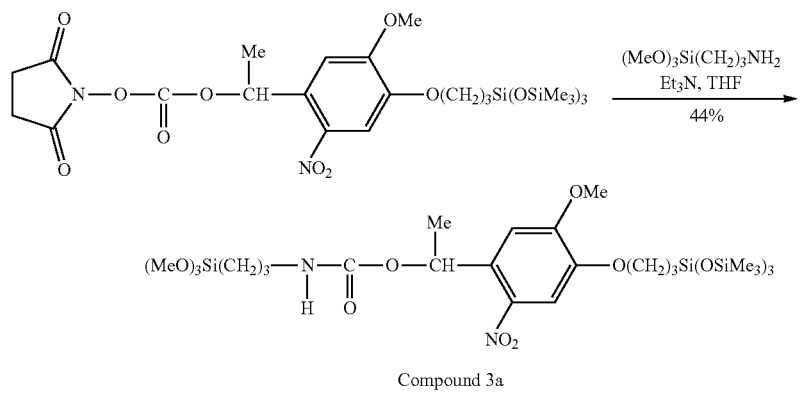

Compound 3a

<Surface Modification>

A silicon wafer provided with a thermal oxide film (SiO₂/Si substrate) was ultrasonically washed with methanol for 5 minutes, dried in a nitrogen flow, and subjected to a pre-treatment by being irradiated with UV light for 1 hour using a UV-ozone cleaner.

Next, the compound 3a obtained according to the above-described method was dissolved in dry toluene to prepare a 1 mM solution, and the substrate which had been subjected to the pre-treatment was put into the solution and immersed therein at room temperature for 20 minutes in a nitrogen atmosphere. The substrate was rinsed with methanol, ultrasonically washed with methanol and chloroform for 5 minutes, and dried using a nitrogen flow (the following step 1).

<Irradiation with Light>

The modified substrate was irradiated with light having a wavelength of 365 nm and an illuminance of 15 J through a filter in air using an ultrahigh-pressure mercury lamp. The substrate was ultrasonically washed with chloroform for 5 minutes and dried using a nitrogen flow (the following step 2).

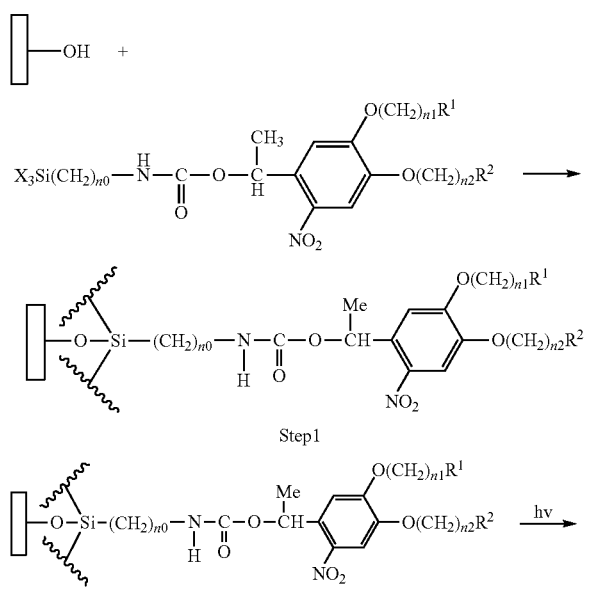

-continued

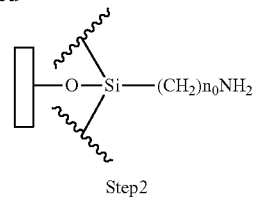

Step2

<Measurement of Contact Angle>

The static contact angle before and after irradiation with light was measured using water, diiodomethane, and 1-bromonaphthalene as a probe liquid with a contact angle meter (Kyowa Interface Science, Inc.) according to a liquid droplet method and a θ/2 method. The results are listed in Table 1. In Table 1, "before irradiation with light" indicates the timing immediately after the above-described step 1, and "after irradiation with light" indicates the timing immediately after the above-described step 2.

TABLE 1

| Modifier | Irradiation with light (15 J) | Contact angle (°) | | |
|---|---|---|---|---|
| | | Water | Diiodomethane | 1-Bromonaphthalene |
| Compound 3a | before | 96.9 ± 1.3 | 62.4 ± 0.8 | 58.5 ± 0.5 |
| Compound 3a | after | 57.8 ± 4.8 | 42.1 ± 1.6 | 31.7 ± 5.9 |

Based on the results listed in Table 1, it was confirmed that the contact angle of the compound 3a free from fluorine after irradiation with light became smaller.

<XPS Measurement>

Figure 4:
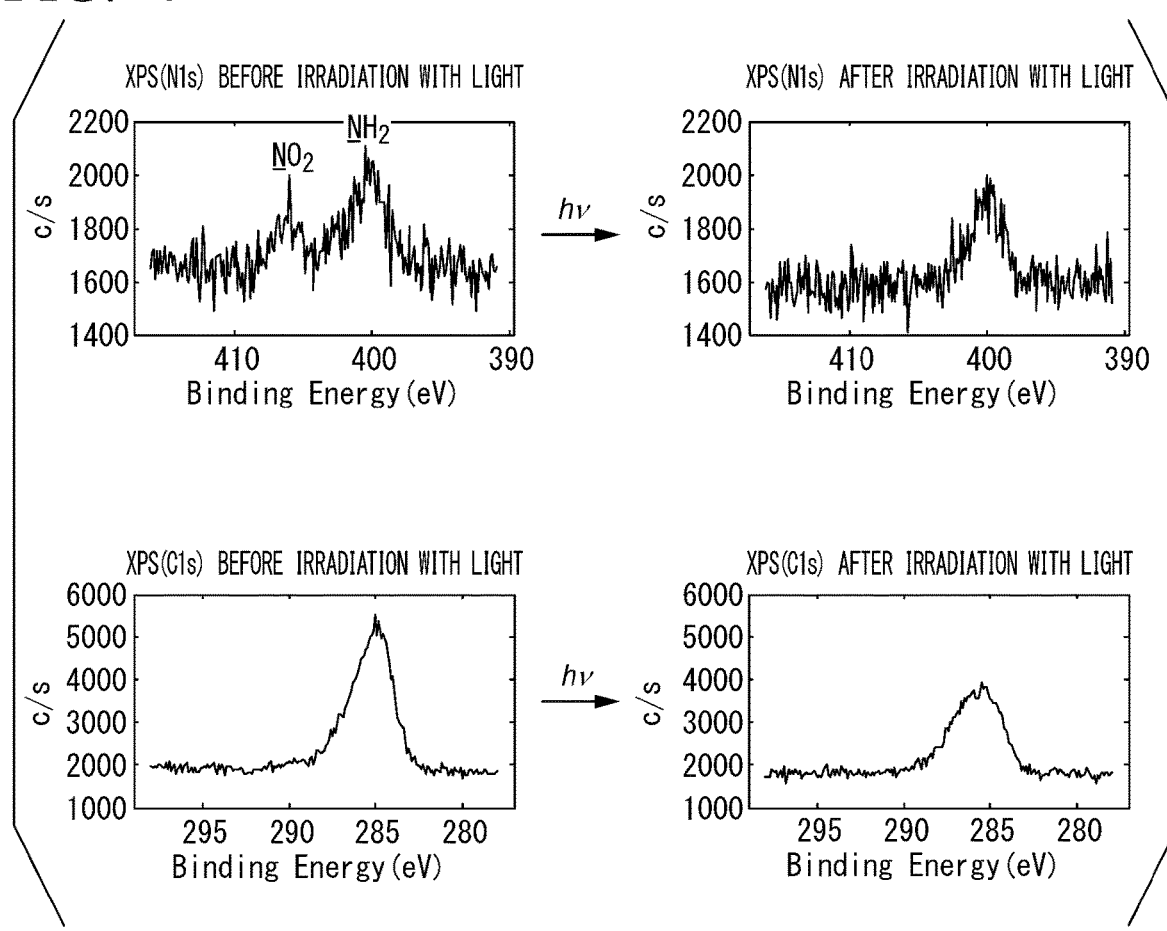
FIG. 4 is a graph showing results of XPS spectra before and after irradiation with light.

The obtained modified substrate before irradiation with light was compared with that after irradiation with light by static contact angle measurement and X-ray photoelectron spectroscopy (hereinafter, referred to as "XPS"). FIG. 4 shows XPS spectra before and after irradiation with light.

It is considered that since the contact angle was large after modification and hydrophobicity was exhibited, the modification was performed on the substrate.

In addition, XPS showed that the modification was able to be carried out because the appearance of a peak derived from a nitro group was observed after the modification.

It was confirmed that the contact angle was reduced after irradiation with light. Further, it was confirmed that since the peak derived from a nitro group was lost after irradiation with light and the number of carbon (C) peaks decreased based on XPS, the photodegradable group was desorbed by irradiation with light.

Synthesis of Compound 3b

Step 1; Synthesis of 1-(4(3-(1,1,3,3,5,5,5-heptam-ethyltrisiloxanyl)propoxy)-5-methoxy-2-nitrophenyl) ethyl N-succinimidyl carbonate The intermediate compound 14 (1.0 g, 2.53 mmol) was put into a 50-mL two-neck eggplant flask to be dissolved in dry tetrahydrofuran (21 mL), 1,1,3,3,5,5,5-heptamethyltrisiloxane (1.13 g, 5.07 mmol) and a Karstedt's catalyst (1.0 mL) were added thereto, and the solution was stirred at room temperature for 3 hours in a nitrogen atmosphere under a light-shielded condition. After concentration, the resultant was purified by silica gel column chromatography (hexane: ethyl acetate:tetramethoxysilane=200:100:3), thereby obtaining 0.597 g (0.968 mmol, 38%) of a yellow viscous material.

The identification result of the obtained intermediate compound 1b is described below.

$^1$H NMR (CDCl$_3$/TMS, 400 MHz): δ 0.03 (6H, s), 0.09 (9H, s), 0.12 (6H, s), 0.62-0.69 (2H, m), 1.76 (3H, d, J=6.4 Hz), 1.86-1.95 (2H, m), 2.80 (4H, s), 3.99-4.05 (2H, m), 4.04 (3H, s), 6.51 (1H, q, J=6.4 Hz), 7.07 (1H, s), 7.63 (1H, s).

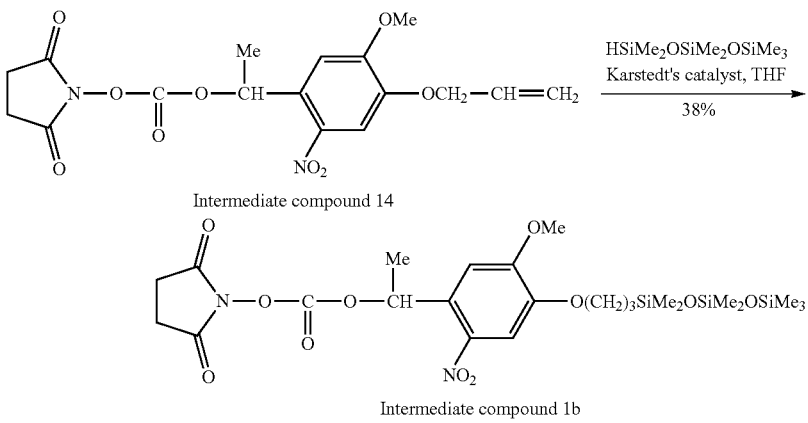

Intermediate compound 14

Intermediate compound 1b

Step 2; Synthesis of 1-(4-(3-(1,1,3,3,5,5,5-heptam-ethyltrisiloxynyl)propoxy)-5-methoxy-2-nitrophe-nyl)ethyl 3-trimethoxysilylpropyl carbamate The intermediate compound 1b (200 mg, 0.324 mmol) was put into a 30-mL two-neck eggplant flask to be dissolved in dry tetrahydrofuran (2 mL), 3-aminopropylt-rimethoxysilane (0.085 mL, 0.486 mmol) and trimethylam-ine (0.113 mL, 0.81 mmol) were added thereto, and the solution was stirred at room temperature for 13 hours in a nitrogen atmosphere under a light-shielded condition. After concentration, the resultant was purified by silica gel column chromatography (hexane:ethyl acetate:tetramethoxysi-lane=50:50:1), thereby obtaining 98 mg (0.144 mmol, 45%) of a light yellow viscous material.

The identification result of the obtained compound 3b is described below.

$^1$H NMR (CDCl$_3$/TMS, 400 MHz): δ 0.03 (6H, s), 0.09 (9H, s), 0.11 (6H, s), 0.58-0.69 (4H, m), 1.53-1.69 (5H, m), 1.84-1.94 (2H, m), 3.06-3.21 (2H, m), 3.56 (9H, s), 3.95 (3H, s), 4.01 (2H, t, J=7.2 Hz), 4.95 (1H, t, J=5.8 Hz), 6.37 (1H, q, J=6.4 Hz), 6.99 (1H, s), 7.56 (1H, s).

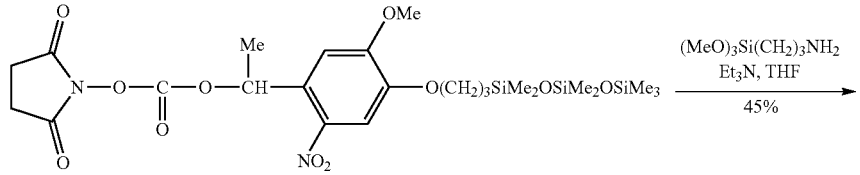

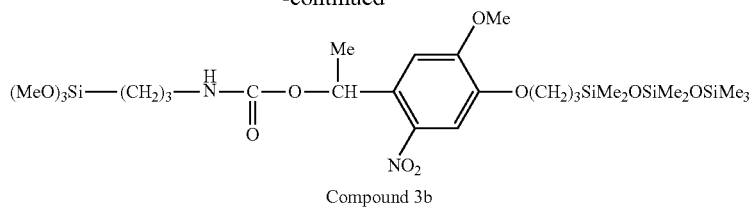

Compound 3b

Synthesis of Compound 4a

Step 1: Synthesis of 1-(3,4-diallyloxyphenyl)ethanone 3,4-Dihydroxyacetophenone (10.0 g, 65.7 mmol) was put into a 300-mL two-neck eggplant flask to be dissolved in acetone (145 mL), potassium carbonate (36.3 g, 263 mmol) was added thereto, the solution was stirred at room temperature for 1 hour, allyl bromide (37.4 g, 309 mmol) was added thereto, and the resulting solution was refluxed for 2.5 hours. After concentration, ethyl acetate (150 mL×3) and pure water (150 mL) were added to the resulting solution for extraction, and the organic layer was washed with saturated saline solution (150 mL×3), dried over anhydrous magnesium sulfate, filtered, and concentrated, thereby obtaining 15.2 g (65.2 mmol, 99%) of a pale yellow solid.

The identification result of the obtained intermediate compound 21 is described below.

$^1$H NMR (CDCl$_3$/TMS, 400 MHz): δ 2.55 (3H, s), 4.65-4.70 (4H, m), 5.29-5.34 (2H, m), 5.41-5.48 (2H, m), 6.03-6.14 (2H, m), 6.88-6.91 (1H, m), 7.53-7.56 (2H, m).

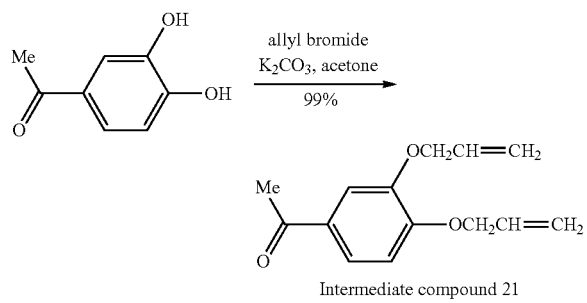

Intermediate compound 21

Step 2: Synthesis of 1-(4,5-diallyloxy-2-nitrophenyl)ethanone

The intermediate compound 21 (15.2 g, 65.2 mmol) was put into a 300-mL eggplant flask to be dissolved in acetic acid (60 mL), fuming nitric acid (27.3 mL) was slowly added thereto for 20 minutes on an ice bath, the progress of the reaction was confirmed by TLC, and the solution was poured into pure water (200 mL). Extraction was carried out using chloroform (250 mL×3), the organic layer was sequentially washed with a 5% sodium bicarbonate aqueous solution (250 mL×2) and saturated saline solution (250 mL×2), dried over anhydrous magnesium sulfate, filtered, and concentrated. The resultant was purified by silica gel column chromatography (hexane:ethyl acetate=4:1), thereby obtaining a pale yellow solid. Recrystallization was carried out from ethanol, thereby obtaining 6.08 g (21.9 mmol, 34%) of needle-like pale yellow crystals.

The identification result of the obtained intermediate compound 22 is described below.

$^1$H NMR (CDCl$_3$/TMS, 400 MHz): δ 2.49 (3H, s), 4.68-4.72 (4H, m), 5.35-5.40 (2H, m), 5.42-5.51 (2H, m), 6.00-6.12 (2H, m), 6.76 (1H, s), 7.62 (1H, s).

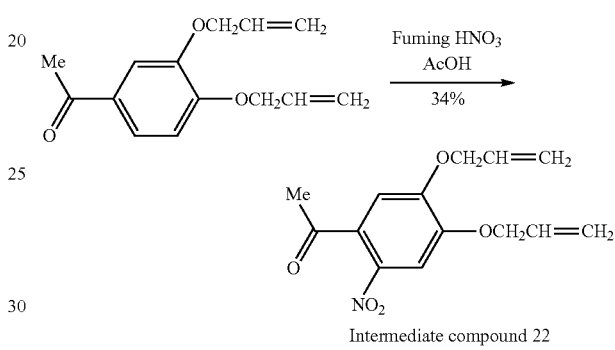

Intermediate compound 22

Step 3: Synthesis of 1-(4,5-diallyloxy-2-nitrophenyl)ethanol

The intermediate compound 22 (6.08 g, 21.9 mmol) was put into a 300-mL eggplant flask to be dissolved in tetrahydrofuran (70 ml), methanol (30 mL) was added thereto, sodium borohydride (2.90 g, 76.7 mmol) was slowly added thereto on an ice bath, and the solution was stirred at 0° C. for 1.5 hours. After concentration, ethyl acetate (100 mL×3), pure water (100 mL), and 2 N hydrochloric acid (15 mL) were added to the resulting solution for extraction, and the organic layer was washed with saturated saline solution (150 mL×2), dried over anhydrous magnesium sulfate, filtered, and concentrated. The obtained yellowish brown solid was washed with hexane and suction-filtered, thereby obtaining 5.51 g (19.7 mmol, 90%) of a yellow solid.

The identification result of the obtained intermediate compound 23 is described below.

$^1$H NMR (CDCl$_3$/TMS, 400 MHz): δ 1.54 (3H, d, J=6.3 Hz), 2.27 (1H, d, J=3.6 Hz), 4.64-4.76 (4H, m), 5.32-5.38 (2H, m), 5.42-5.50 (2H, m), 5.51-5.57 (1H, m), 6.02-6.13 (2H, m), 7.30 (1H, s), 7.59 (1H, s).

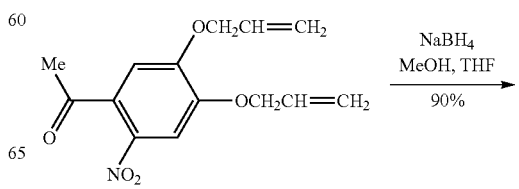

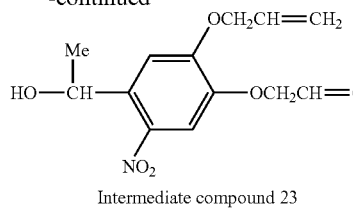

Intermediate compound 23

Step 4: Synthesis of 1-(4,5-diallyloxy-2-nitrophenyl)ethyl N-succinimidyl carbonate The intermediate compound 23 (2.86 g, 10.2 mmol) was put into a 300-mL two-neck eggplant flask to be dissolved in dry acetonitrile (35 mL), di(N-succinimidyl)carbonate (4.46 g, 17.4 mmol) and trimethylamine (3.21 g, 31.7 mmol) were added thereto, and the solution was stirred at room temperature for 19 hours in a nitrogen atmosphere. After concentration, ethyl acetate (250 mL×3) and pure water (250 mL) were added to the resulting solution for extraction, and the organic layer was washed with saturated saline solution (250 mL×3), dried over anhydrous magnesium sulfate, filtered, and concentrated. The resultant was purified by silica gel chromatography (hexane:ethyl acetate=2:1), thereby obtaining 3.13 g (7.45 mmol, 73%) of a white-yellow solid.

The identification result of the obtained intermediate compound 24 is described below.

$^1$H NMR (CDCl$_3$/TMS, 400 MHz): δ 1.74 (3H, d, J=6.4 Hz), 2.80 (4H, s), 4.65-4.69 (2H, m), 4.73-4.86 (2H, m), 5.33-5.41 (2H, m), 5.43-5.54 (2H, m), 6.01-6.16 (2H, m), 6.50 (1H, q, J=6.4 Hz), 7.10 (1H, s), 7.65 (1H, s).

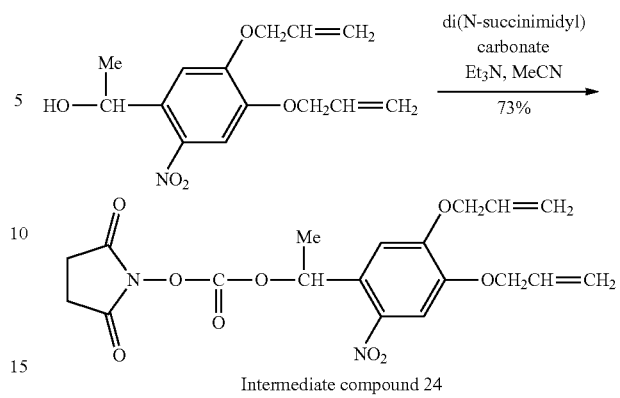

Intermediate compound 24

Step 5: Synthesis of 1-(2-nitro-4,5-bis(3-tris(trimethylsiloxy)silylpropoxy)phenyl)ethyl N-succinimidyl carbonate The intermediate compound 24 (400 mg, 0.95 mmol) was put into a 30-mL two-neck eggplant flask to be dissolved in dry tetrahydrofuran (10 mL), tris(trimethylsiloxy)silane (1.41 g, 4.75 mmol) and a Karstedt's catalyst (10 drops) were added thereto, and the solution was stirred at room temperature for 27 hours in a nitrogen atmosphere. After concentration, the resultant was purified by silica gel chromatography (hexane:ethyl acetate=8:1, containing 1% of tetramethoxysilane), thereby obtaining 314 mg (0.31 mmol, 33%) of a yellow viscous material.

The identification result of the obtained intermediate compound 2a is described below.

$^1$H NMR (CDCl$_3$/TMS, 400 MHz): δ 0.10-0.11 (54H, m), 0.54-0.65 (4H, m), 1.75 (3H, d, J=6.4 Hz), 1.83-1.97 (4H, m), 2.80 (4H, s), 3.97-4.17 (4H, m), 6.52 (1H, q, J=6.6 Hz), 7.05 (1H, s), 7.61 (1H, s).

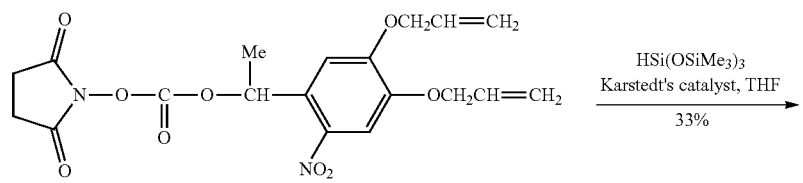

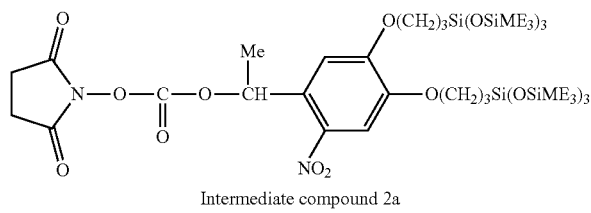

Intermediate compound 2a

Step 6: Synthesis of 1-(2-nitro-4,5-bis(3-tris(trimethylsiloxy)silylpropoxy)phenyl)ethyl 3-trimethoxysilylpropyl carbamate The intermediate compound 2a (147 mg, 0.145 mmol) was put into a 30-mL two-neck eggplant flask to be dissolved in dry tetrahydrofuran (7 mL), 3-aminopropyltrimethoxysilane (78 mg, 0.43 mmol) and triethylamine (44 mg, 0.43 mmol) were added thereto, and the solution was stirred at room temperature for 13 hours in a nitrogen atmosphere under a light-shielded condition. After concentration, the resultant was purified by silica gel chromatography (hexane:ethyl acetate=3:1, containing 1% of tetramethoxysilane), thereby obtaining 64 mg (0.059 mmol, 41%) of a light yellow viscous material.

The identification result of the obtained compound 4a is described below.

$^1$H NMR (CDCl$_3$/TMS, 400 MHz): δ 0.09-0.12 (54H, m), 0.51-0.67 (6H, m), 1.52-1.66 (5H, m), 1.81-1.94 (4H, m), 3.03-3.22 (2H, m), 3.56 (9H, s), 3.93-4.05 (4H, m), 4.88 (1H, t, J=5.9 Hz), 6.37 (1H, q, J=6.4 Hz), 6.97 (1H, s), 7.55 (1H, s).

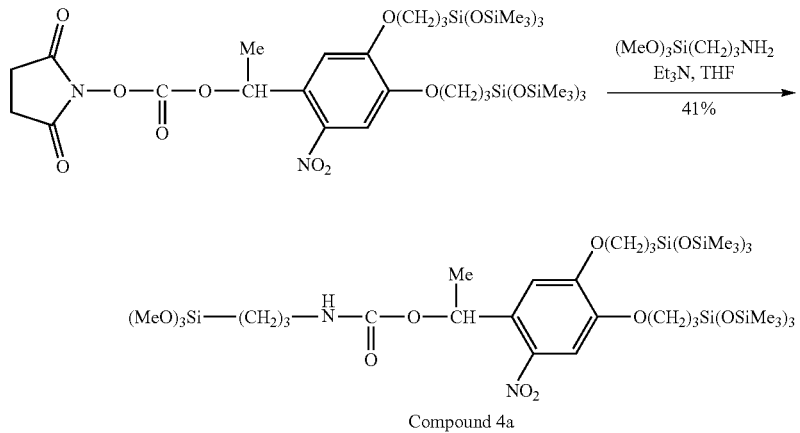

Compound 4a

Synthesis of Compound 4b

Step 1: Synthesis of 1-(4,5-bis(3-(1,1,3,3,5,5,5-heptamethyltrisiloxanyl)propoxy)-2-nitrophenyl)ethyl N-succinimidyl carbonate The intermediate compound 24 (800 mg, 1.90 mmol) was put into a 30-mL two-neck eggplant flask to be dissolved in dry tetrahydrofuran (15 mL), 1,1,3,3,5,5,5-heptamethyltrisiloxane (1.69 g, 7.61 mmol) and a Karstedt's catalyst (10 drops) were added thereto, and the solution was stirred at room temperature for 4 hours in a nitrogen atmosphere. After concentration, the resultant was purified by silica gel chromatography (hexane:ethyl acetate=8:1, containing 1% of tetramethoxysilane), thereby obtaining 527 mg (0.60 mmol, 32%) of a yellow viscous material.

The identification result of the obtained compound 2b is described below.

$^1$H NMR (CDCl$_3$/TMS, 400 MHz): δ 0.03 (6H, s), 0.04 (6H, s), 0.08 (9H, s), 0.09 (9H, s), 0.12 (6H, s), 0.12 (6H, s), 0.63-0.73 (4H, m), 1.75 (3H, d, J=6.4 Hz), 1.84-1.96 (4H, m), 2.80 (4H, s), 3.97-4.21 (4H, m), 6.48-6.55 (1H, m), 7.05 (1H, s), 7.61 (1H, s).

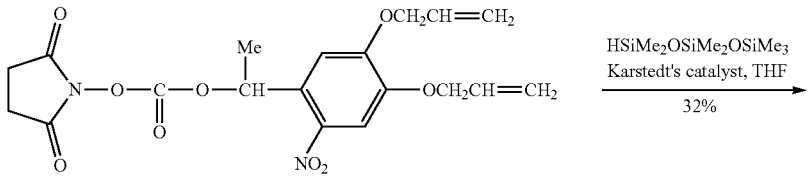

Intermediate compound 24

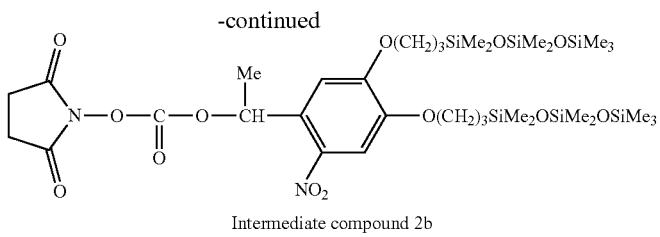

Intermediate compound 2b

Step 2: Synthesis of 1-(4,5-bis(3-(1,1,3,3,5,5,5-heptamethyltrisiloxynyl)propoxy)-2-nitrophenyl) ethyl 3-trimethoxysilylpropyl carbamate The intermediate compound 2b (500 mg, 0.578 mmol) was put into a 30-mL two-neck eggplant flask to be dissolved in dry tetrahydrofuran (10 mL), 3-aminopropyltrimethoxysilane (0.122 mL, 0.692 mmol) and triethylamine (70 mg, 0.69 mmol) were added thereto, and the solution was stirred at room temperature for 3 hours in a nitrogen atmosphere under a light-shielded condition. After concentration, the resultant was purified by silica gel chromatography (hexane:ethyl acetate=3:1, containing 1% of tetramethoxysilane), thereby obtaining 342 mg (0.368 mmol, 64%) of a light yellow viscous material.

The identification result of the obtained compound 4b is described below.

$^1$H NMR (CDCl$_3$/TMS, 400 MHz): δ 0.025 (6H, s), 0.031 (6H, s), 0.080 (9H, s), 0.085 (9H, s), 0.11 (6H, s), 0.12 (6H, s), 0.58-0.71 (6H, m), 1.53-1.67 (5H, m), 1.82-1.94 (4H, m), 3.03-3.22 (2H, m), 3.56 (9H, s), 3.99 (2H, t, J=7.0 Hz), 4.03 (2H, t, J=7.0 Hz), 4.90 (1H, t, J=5.8 Hz), 6.37 (1H, q, J=6.4 Hz), 6.97 (1H, s), 7.55 (1H, s).

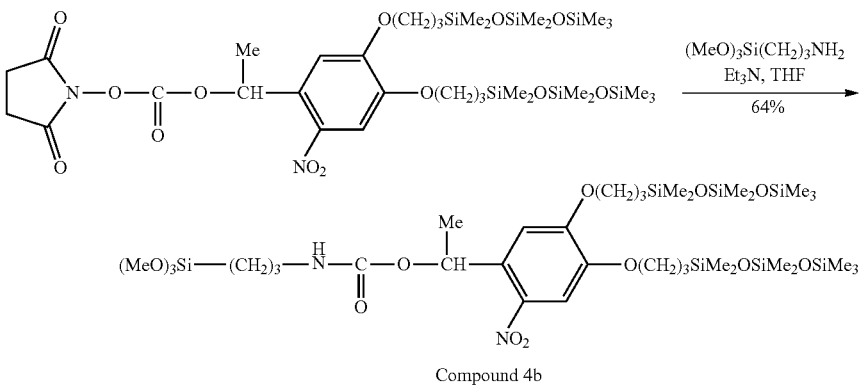

Compound 4b

Synthesis of Compound 4c

Step 1: Synthesis of 1-(4,5-bis(3-(polydimethylsiloxanyl)propoxy)-2-nitrophenyl)ethyl N-succinimidyl carbonate The intermediate compound 24 (1.01 g, 2.39 mmol) was put into a 200-mL two-neck eggplant flask to be dissolved in dry tetrahydrofuran (30 mL), polydimethylsiloxane (6.69 g, 6.19 mmol) and a Karstedt's catalyst (10 drops) were added thereto, and the solution was stirred at room temperature for 20 hours in a nitrogen atmosphere. After concentration, the resultant was purified by silica gel chromatography (hexane:ethyl acetate=8:1, containing 1% of tetramethoxysilane), thereby obtaining 630 mg (0.26 mmol, 11%) of a yellow viscous material.

The identification result of the obtained compound 2c is described below.

$^1$H NMR (CDCl$_3$/TMS, 400 MHz): δ 0.03-0.14 (156H, m), 0.49-0.57 (4H, m), 0.62-0.75 (4H, m), 0.88 (6H, t, J=7.0 Hz), 1.24-1.38 (8H, m), 1.75 (3H, d, J=6.4 Hz), 1.83-1.97 (4H, m), 2.80 (4H, s), 3.97-4.21 (4H, m), 6.48-6.55 (1H, m), 7.04 (1H, s), 7.61 (1H, s).

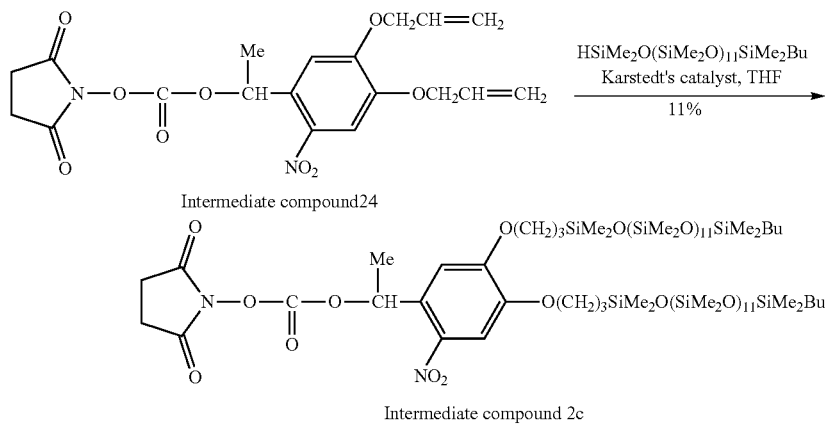

Intermediate compound 2c

Step 2: Synthesis of 1-(4,5-bis (3-(polydimethylsi-lyloxanyl)propoxy)-2-nitrophenyl)ethyl 3-trimethyoxysilylpropyl carbamate The intermediate compound 2c (305 mg, 0.12 mmol) was put into a 30-mL two-neck eggplant flask to be dissolved in dry tetrahydrofuran (12 mL), 3-aminopropyltrimethoxysilane (66 mg, 0.37 mmol) and triethylamine (37 mg, 0.37 mmol) were added thereto, and the solution was stirred at room temperature for 2.5 hours in a nitrogen atmosphere under a light-shielded condition. After concentration, the resultant was purified by silica gel column chromatography (hexane:ethyl acetate=2:1, containing 1% of tetramethoxysilane), thereby obtaining 91 mg (0.036 mmol, 29%) of a yellow viscous material.

The identification result of the obtained compound 4c is described below.

$^1$H NMR (CDCl$_3$/TMS, 400 MHz): δ 0.02-0.14 (156H, m), 0.49-0.57 (4H, m), 0.58-0.71 (6H, m), 0.88 (3H, t, J=7.0 Hz), 1.24-1.36 (8H, m), 1.52-1.65 (5H, m), 1.81-1.94 (4H, m), 3.03-3.23 (2H, m), 3.56 (9H, s), 3.98 (2H, t, J=7.0 Hz), 4.03 (2H, t, J=7.0 Hz), 4.89 (1H, t, J=5.7 Hz), 6.33-6.40 (1H, m), 6.97 (1H, s), 7.55 (1H, s).

Next, each of the compounds 3b, 4a, 4b, and 4c obtained according to the above-described method was dissolved in dry toluene to prepare a 1 mM (the concentration of the compounds 4a, 4b, and 4c was set to 0.1 mM) solution, and the substrate which had been subjected to the pre-treatment was put into the solution and immersed therein at room temperature for 20 hours (the time for the compounds 4a and 4c was set to 24 hours) in a nitrogen atmosphere. The substrate was ultrasonically washed with chloroform for 5 minutes and dried using a nitrogen flow (the following step 1).

<Irradiation with Light>

The modified substrate was irradiated with light having a wavelength of 365 nm and an illuminance of 15 J (set to 10 J only in the case of the compound 4b) through a filter in air using an ultrahigh-pressure mercury lamp. The substrate was ultrasonically washed with chloroform for 5 minutes and dried using a nitrogen flow (the following step 2).

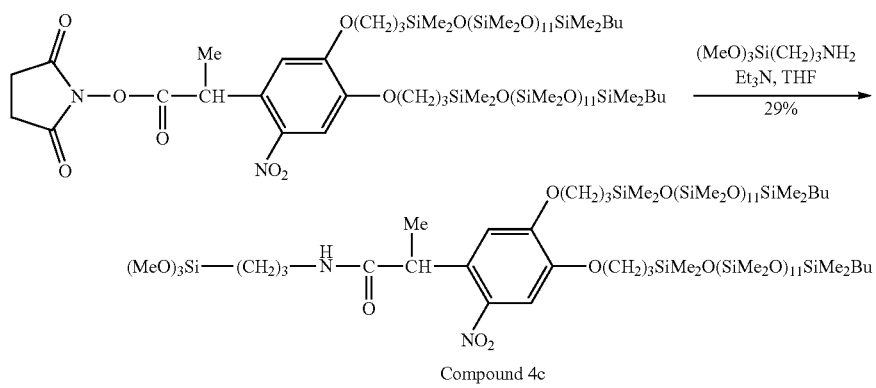

Compound 4c

<Surface Modification>

A silicon wafer provided with a thermal oxide film (SiO$_2$/Si substrate) was ultrasonically washed for 5 minutes with pure water, acetone, methanol, and chloroform, dried in a nitrogen flow, and subjected to a pre-treatment by being irradiated with UV for 1 hour using a UV-ozone cleaner.

-continued

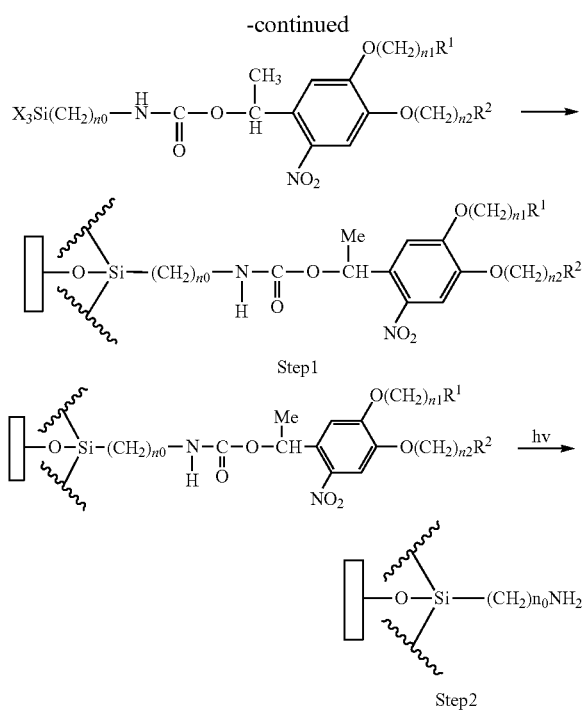

Step1

Step2

<Measurement of Contact Angle>

The static contact angle before and after irradiation with light was measured using water, diiodomethane, and 1-bromonaphthalene as a probe liquid with a contact angle meter (Kyowa Interface Science, Inc.) according to a liquid droplet method and a θ/2 method. The results are listed in the table. In the table below, "before irradiation with light" indicates the timing immediately after the above-described step 1, and "after irradiation with light" indicates the timing immediately after the above-described step 2.

TABLE 2

| Modifier | Irradiation with light (15 J) | Contact angle (°) | | |
|---|---|---|---|---|
| | | Water | Diiodomethane | 1-Bromonaphthalene |
| Compound 3b | before | 81.8 ± 0.6 | 45.8 ± 0.3 | 40.2 ± 0.3 |
| Compound 3b | after | 46.7 ± 0.5 | 35.0 ± 0.0 | 22.1 ± 0.6 |
| Compound 4a | before | 96.2 ± 2.4 | 56.0 ± 0.8 | 53.3 ± 1.7 |
| Compound 4a | after | 43.3 ± 3.4 | 35.1 ± 4.1 | 17.2 ± 2.4 |
| Compound 4b | before | 83.0 ± 4.3 | 45.7 ± 0.5 | 48.7 ± 0.3 |
| Compound 4b | after (10 J) | 52.3 ± 1.2 | 33.5 ± 1.4 | 22.6 ± 0.6 |
| Compound 4c | before | 91.4 ± 0.6 | 61.7 ± 1.1 | 54.4 ± 0.9 |
| Compound 4c | after | 61.4 ± 1.8 | 46.2 ± 0.7 | 37.4 ± 1.4 |

<XPS Measurement>

Figure 5:
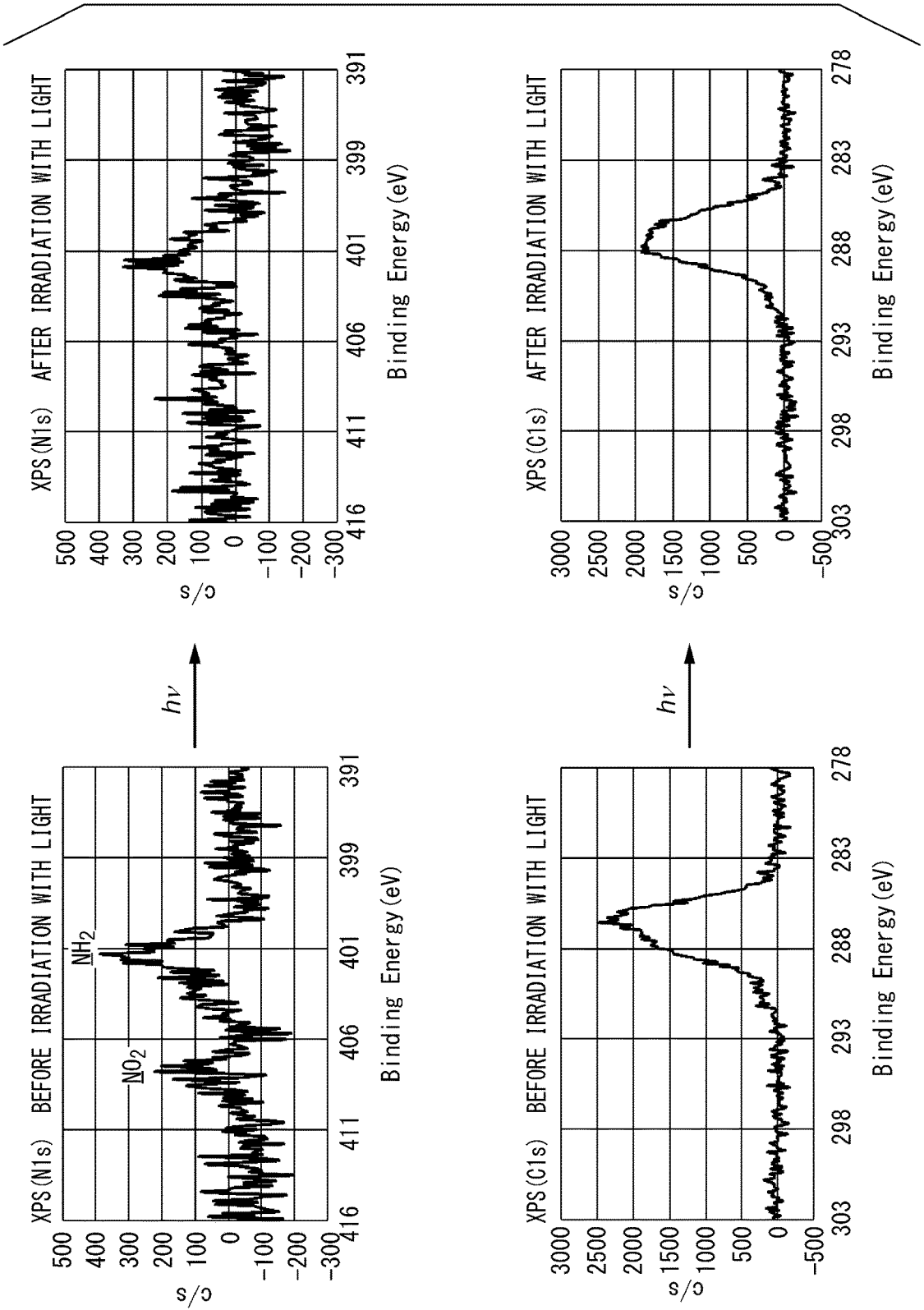
FIG. 5 is a graph showing results of XPS spectra before and after irradiation with light.
Figure 6:
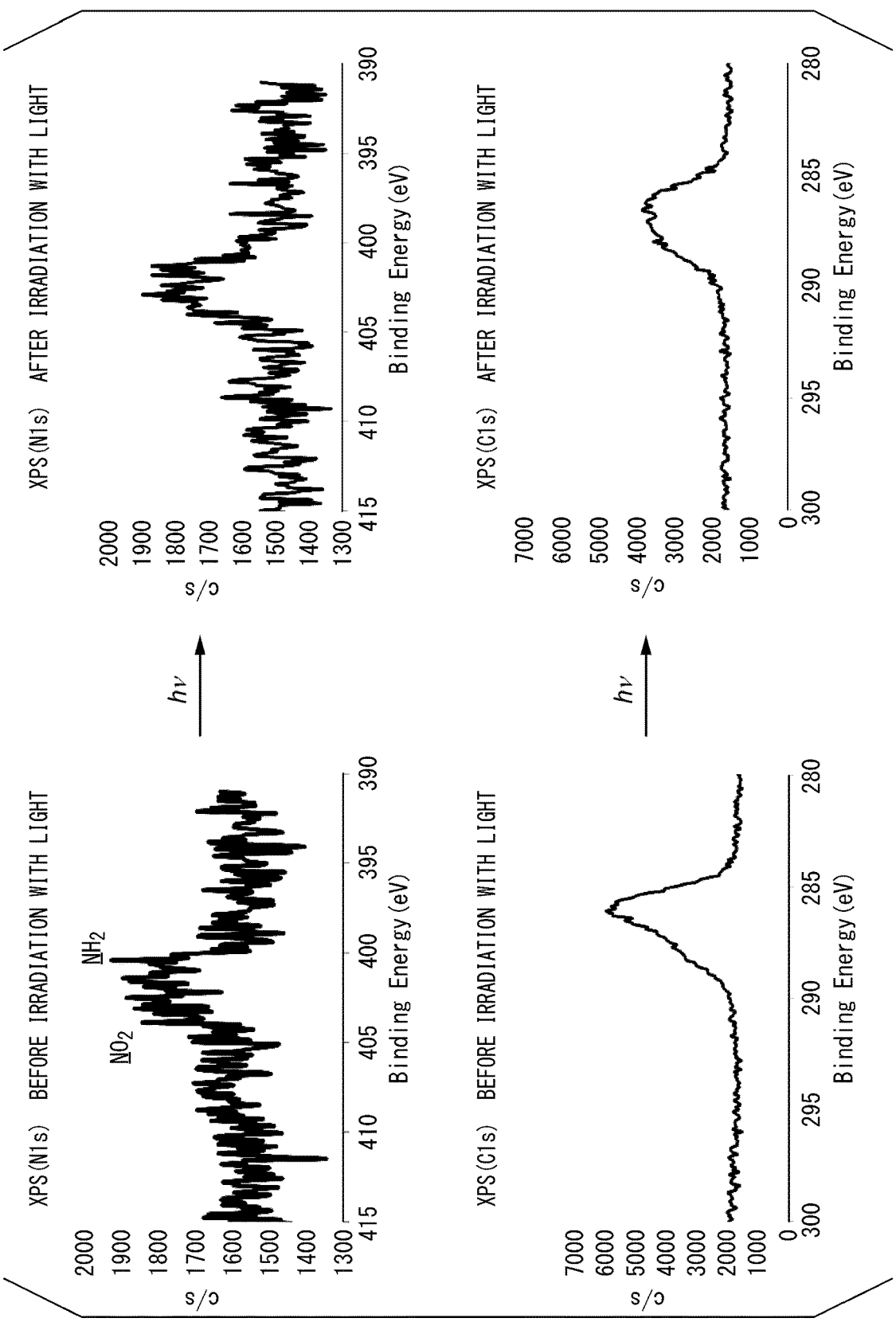
FIG. 6 is a graph showing results of XPS spectra before and after irradiation with light.
Figure 7:
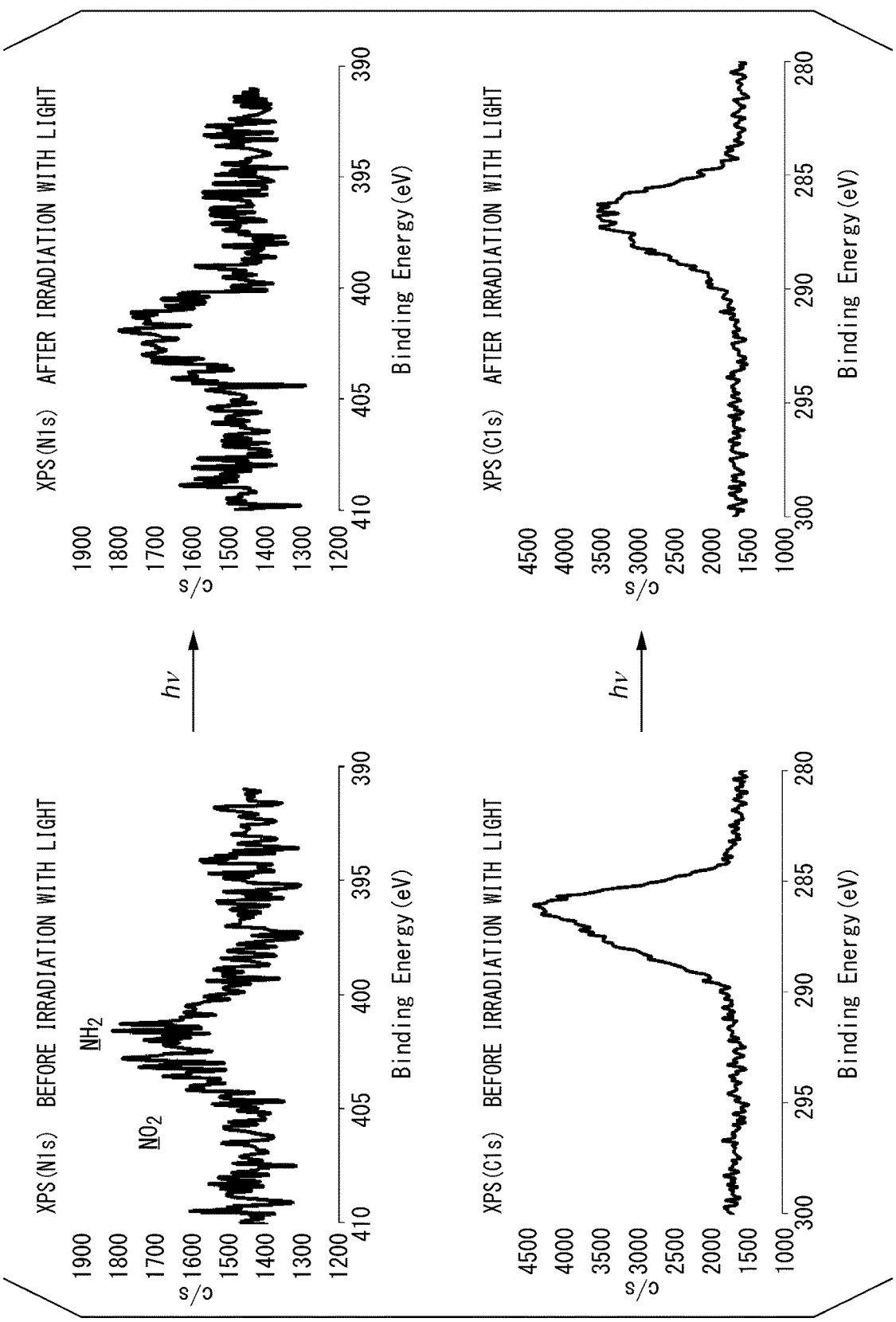
FIG. 7 is a graph showing results of XPS spectra before and after irradiation with light.
Figure 8:
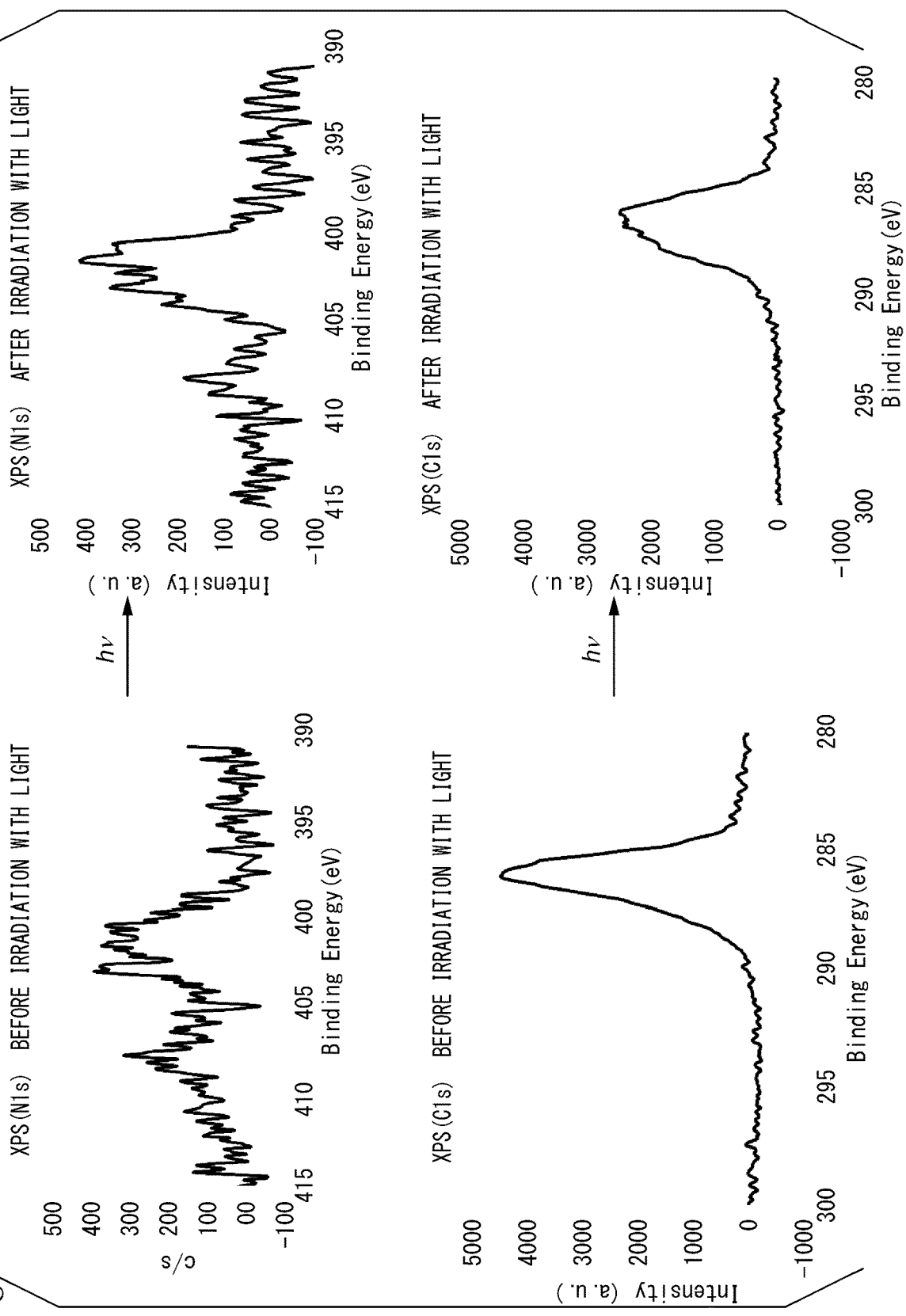
FIG. 8 is a graph showing results of XPS spectra before and after irradiation with light.

The evaluation was made by X-ray photoelectron spectroscopy (hereinafter, referred to as "XPS"). FIG. 5 shows the XPS spectra before and after the substrate modified with the compound 3b was irradiated with light; FIG. 6 shows the XPS spectra before and after the substrate modified with the compound 4a was irradiated with light; FIG. 7 shows the XPS spectra before and after the substrate modified with the compound 4b was irradiated with light; and FIG. 8 shows the XPS spectra before and after the substrate modified with the compound 4c was irradiated with light.

The obtained modified substrate before irradiation with light was compared with that after irradiation with light by static contact angle measurement and XPS.

It is considered that since the contact angle was large after modification and hydrophobicity was exhibited, the modification was performed on the substrate.

In the compounds 3b, 4a, and 4c, the appearance of a peak derived from a nitro group was able to be confirmed by XPS after modification. In the case of the compound 4b, a clear peak derived from a nitro group was not confirmed by XPS, and the reason for this is considered that the film thickness was small and sufficient sensitivity was not be obtained.

It was confirmed that the contact angle was reduced after irradiation with light. Further, it was confirmed that peaks derived from a nitro group were lost after irradiation with light in the case of the compounds 3b, 4a, and 4c based on XPS. Further, it was confirmed that the number of carbon (C) peaks decreased in all the compounds, the photodegradable group was desorbed by irradiation with light.

REFERENCE SIGNS LIST

S: substrate
CONT: control unit
Sa: surface to be treated
2: substrate supply unit
3: substrate treatment unit
4: substrate recovery unit
6: compound-coating unit
7: exposure unit
8: mask
9: patterned material coating unit
100: substrate treatment device

The invention claimed is:
1. A compound represented by Formula (1)

$$X_3Si(CH_2)_{n0}-\overset{H}{N}-\underset{O}{\overset{\|}{C}}-O-\overset{CH_3}{\underset{H}{C}}-\underset{NO_2}{\phantom{X}}-O-(CH_2)_{n1}-R^1,\ O-(CH_2)_{n2}-R^2 \quad (1)$$

[in the formula, X represents a halogen atom or an alkoxy group, $R^1$ represents any one group selected from an alkyl group having 1 to 5 carbon atoms, a group represented by Formula (R2-1), and a group represented by Formula (R2-2), $R^2$ represents a group represented by Formula (R2-1) or (R2-2), n0 represents an integer of 0 or greater, n1 represents an integer of 0 to 5, and n2 represents a natural number of 1 to 5]

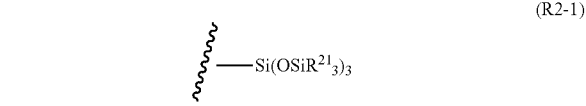

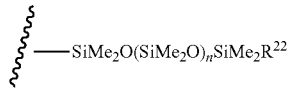

(R2-2)

[in the formulae, $R^{21}$ and $R^{22}$ each independently represents an alkyl group having 1 to 5 carbon atoms, n represents a natural number, and the wavy line represents a bonding site].

2. The compound according to claim 1, wherein $R^{21}$ or $R^{22}$ represents any of a methyl group, an isopropyl group, or a tert-butyl group.

3. A substrate for pattern formation, which has a surface chemically modified by the compound according to claim 1.

4. A photodegradable coupling agent formed of the compound according to claim 1.

5. A pattern formation method of forming a pattern on a surface of an object to be treated, the method comprising:
chemically modifying the surface to be treated using the compound according to claim 1;
irradiating the chemically modified surface to be treated with light having a predetermined pattern to generate a latent image formed of a hydrophilic region and a water-repellent region; and
disposing a pattern-forming material in the hydrophilic region or the water-repellent region.

6. The pattern formation method according to claim 5, wherein the predetermined pattern corresponds to a circuit pattern for an electronic device.

7. The pattern formation method according to claim 5, wherein the pattern-forming material contains a conductive material, a semiconductor material, or an insulating material.

8. The pattern formation method according to claim 7, wherein the conductive material is formed of a conductive fine particle dispersion liquid.

9. The pattern formation method according to claim 7, wherein the semiconductor material is formed of an organic semiconductor material dispersion liquid.

10. A pattern formation method of forming a pattern on a surface of an object to be treated, the method comprising:
chemically modifying the surface to be treated using the compound according to claim 1;
irradiating the chemically modified surface to be treated with light having a predetermined pattern to generate a latent image formed of a hydrophilic region and a water-repellent region; and
disposing a catalyst for electroless plating in the hydrophilic region and performing electroless plating.

11. The pattern formation method according to claim 5, wherein the object is a substrate having flexibility.

12. The pattern formation method according to claim 5, wherein the object is formed of a resin material.

13. The pattern formation method according to claim 5, wherein the light includes light having a wavelength included in a range of 200 nm to 450 nm.

14. A transistor production method of producing a transistor which includes a gate electrode, a source electrode, and a drain electrode, the method comprising:
forming at least one electrode among the gate electrode, the source electrode, and the drain electrode using the pattern formation method according to claim 5.

* * * * *

UNITED STATES PATENT AND TRADEMARK OFFICE
CERTIFICATE OF CORRECTION

PATENT NO. : 11,953,833 B2
APPLICATION NO. : 16/843232
DATED : April 9, 2024
INVENTOR(S) : Yusuke Kawakami et al.

It is certified that error appears in the above-identified patent and that said Letters Patent is hereby corrected as shown below:

On the Title Page

Item (71), delete "KANAGAWA UNIVERSITY, Yokohama (JP)"

Signed and Sealed this
Twenty-second Day of October, 2024

Katherine Kelly Vidal
*Director of the United States Patent and Trademark Office*